United States Patent
Scheller et al.

(10) Patent No.: US 11,194,004 B2
(45) Date of Patent: Dec. 7, 2021

(54) DIAGNOSTIC CIRCUITS AND METHODS FOR SENSOR TEST CIRCUITS

(71) Applicant: Allegro MicroSystems, LLC, Manchester, NH (US)

(72) Inventors: P. Karl Scheller, Dover, NH (US); Devon Fernandez, Londonderry, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 97 days.

(21) Appl. No.: 16/788,505

(22) Filed: Feb. 12, 2020

(65) Prior Publication Data
US 2021/0247478 A1    Aug. 12, 2021

(51) Int. Cl.
*G01R 35/00*    (2006.01)
*G01D 5/16*    (2006.01)
*G01D 5/14*    (2006.01)

(52) U.S. Cl.
CPC .......... *G01R 35/005* (2013.01); *G01D 5/142* (2013.01); *G01D 5/16* (2013.01)

(58) Field of Classification Search
CPC ......... G01R 35/005; G01D 5/16; G01D 5/142
See application file for complete search history.

(56) References Cited

U.S. PATENT DOCUMENTS

| | | |
|---|---|---|
| 4,236,832 A | 12/1980 | Komatsu et al. |
| 4,438,347 A | 3/1984 | Gehring |
| 4,732,494 A | 3/1988 | Guers et al. |
| 4,752,733 A | 6/1988 | Petr et al. |
| 4,758,943 A | 7/1988 | Aström et al. |
| 4,760,285 A | 7/1988 | Nelson |
| 4,823,075 A | 4/1989 | Alley |
| 4,833,406 A | 5/1989 | Foster |
| 4,970,411 A | 11/1990 | Halg et al. |
| 5,026,178 A | 6/1991 | Ballhaus |

(Continued)

FOREIGN PATENT DOCUMENTS

| | | |
|---|---|---|
| DE | 38 29 815 A1 | 3/1990 |
| DE | 195 39 458 A1 | 4/1997 |

(Continued)

OTHER PUBLICATIONS

Response to Japanese Office Action (Machine English Translation from Espacenet.com) dated Mar. 9, 2021 for Japanese Application No. 202-75918; Filed Apr. 16, 2021: 12 Pages.

(Continued)

*Primary Examiner* — Alvaro E Fortich
(74) *Attorney, Agent, or Firm* — Daly, Crowley, Mofford & Durkee, LLP

(57) ABSTRACT

A sensor includes a detector configured to sense a parameter, at least one test circuit configured to detect a respective fault condition of the sensor and generate a fault signal in response to detecting the fault condition, a checker configured to test the at least one test circuit to determine the operational status of the at least one test circuit, and an output signal generator, coupled to receive the sensed parameter, the fault signal, and the operational status of the at least one test circuit. The output signal generator is configured to generate an output signal of the sensor to communicate the sensed parameter and the operational status of the at least one test circuit.

28 Claims, 10 Drawing Sheets

(56) References Cited

U.S. PATENT DOCUMENTS

| | | |
|---|---|---|
| 5,038,246 A | 8/1991 | Durivage, III |
| 5,247,278 A | 9/1993 | Pant et al. |
| 5,329,416 A | 7/1994 | Ushiyama et al. |
| 5,412,255 A | 5/1995 | Wallrafen |
| 5,424,558 A | 6/1995 | Borden et al. |
| 5,469,058 A | 11/1995 | Dunnam |
| 5,521,501 A | 5/1996 | Dettmann et al. |
| 5,621,319 A | 4/1997 | Bilotti et al. |
| 5,640,090 A | 6/1997 | Furuya et al. |
| 6,011,770 A | 1/2000 | Tan |
| 6,014,091 A | 1/2000 | Noltemeyer et al. |
| 6,240,534 B1 * | 5/2001 | Nakane ............ G06F 11/0757 700/79 |
| 6,262,871 B1 | 7/2001 | Nemir et al. |
| 6,351,506 B1 | 2/2002 | Lewicki |
| 6,392,478 B1 | 5/2002 | Mulder et al. |
| 6,436,748 B1 | 8/2002 | Forbes et al. |
| 6,437,558 B2 | 8/2002 | Li et al. |
| 6,456,085 B1 | 9/2002 | Dietl et al. |
| 6,542,847 B1 | 4/2003 | Lohberg et al. |
| 6,573,710 B1 | 6/2003 | Santos et al. |
| 6,687,644 B1 | 2/2004 | Zinke et al. |
| 6,815,944 B2 | 11/2004 | Vig et al. |
| 6,853,178 B2 | 2/2005 | Hayat-Dawoodi |
| 6,896,407 B2 | 5/2005 | Nomiyama et al. |
| 6,917,321 B1 | 7/2005 | Haurie et al. |
| 7,026,808 B2 | 4/2006 | Vig et al. |
| 7,038,448 B2 | 5/2006 | Schott et al. |
| 7,184,876 B2 | 2/2007 | Teulings et al. |
| 7,190,784 B2 | 3/2007 | Li |
| 7,259,545 B2 | 8/2007 | Stauth et al. |
| 7,292,095 B2 | 11/2007 | Burt et al. |
| 7,319,319 B2 | 1/2008 | Jones et al. |
| 7,323,870 B2 | 1/2008 | Tatschl et al. |
| 7,325,175 B2 | 1/2008 | Momtaz |
| 7,425,821 B2 | 9/2008 | Monreal et al. |
| 7,474,093 B2 | 1/2009 | Ausserlechner |
| 7,518,354 B2 | 4/2009 | Stauth et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,769,110 B2 | 8/2010 | Momtaz |
| 7,800,389 B2 | 9/2010 | Friedrich et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,128,549 B2 | 3/2012 | Testani et al. |
| 8,134,358 B2 | 3/2012 | Charlier et al. |
| 8,269,491 B2 | 9/2012 | Cummings et al. |
| 8,447,556 B2 | 5/2013 | Friedrich et al. |
| 8,542,010 B2 | 9/2013 | Cesaretti et al. |
| 8,577,634 B2 | 11/2013 | Donovan et al. |
| 8,624,588 B2 | 1/2014 | Vig et al. |
| 8,680,846 B2 | 3/2014 | Cesaretti et al. |
| 8,680,848 B2 | 3/2014 | Foletto et al. |
| 8,692,546 B2 | 4/2014 | Cesaretti et al. |
| 8,754,640 B2 | 6/2014 | Vig et al. |
| 8,818,749 B2 | 8/2014 | Friedrich et al. |
| 8,860,404 B2 | 10/2014 | Dwyer et al. |
| 8,994,369 B2 | 3/2015 | Vig et al. |
| 9,046,562 B2 | 6/2015 | Cummings et al. |
| 9,068,859 B2 | 6/2015 | Dwyer et al. |
| 9,151,771 B2 | 10/2015 | Vig et al. |
| 9,151,807 B2 | 10/2015 | Friedrich et al. |
| 9,222,990 B2 | 12/2015 | Dwyer et al. |
| 9,664,748 B2 | 5/2017 | Friedrich et al. |
| 9,739,846 B2 | 8/2017 | Petrie et al. |
| 9,851,416 B2 | 12/2017 | Scheller et al. |
| 9,910,088 B2 | 3/2018 | Milano et al. |
| 10,216,559 B2 | 2/2019 | Fernandez |
| 10,380,879 B2 | 8/2019 | Haas et al. |
| 10,436,606 B2 | 10/2019 | Kerdraon et al. |
| 10,481,218 B2 | 11/2019 | Prentice et al. |
| 10,495,485 B2 | 12/2019 | Burdette et al. |
| 10,656,170 B2 | 5/2020 | Lim et al. |
| 2002/0084923 A1 | 7/2002 | Li |
| 2003/0038675 A1 | 2/2003 | Gailus et al. |
| 2003/0102909 A1 | 6/2003 | Motz |
| 2003/0164711 A1 | 9/2003 | Ishida |
| 2003/0234652 A1 | 12/2003 | Bald |
| 2004/0056647 A1 | 3/2004 | Stauth et al. |
| 2005/0038623 A1 | 2/2005 | Hammerschmidt |
| 2005/0183489 A1 | 8/2005 | Weinberg et al. |
| 2006/0125622 A1 | 6/2006 | Baldwin et al. |
| 2006/0152210 A1 | 7/2006 | Mangtani et al. |
| 2006/0202692 A1 | 9/2006 | Tatschl et al. |
| 2007/0110199 A1 | 5/2007 | Momtaz et al. |
| 2007/0247141 A1 | 10/2007 | Pastre et al. |
| 2007/0285089 A1 | 12/2007 | Ibuki et al. |
| 2008/0094055 A1 | 4/2008 | Monreal et al. |
| 2008/0137784 A1 | 6/2008 | Krone |
| 2008/0238410 A1 | 10/2008 | Charlier et al. |
| 2009/0001964 A1 | 1/2009 | Strazalkowski |
| 2009/0001972 A1 | 1/2009 | Fernandez et al. |
| 2009/0085706 A1 | 4/2009 | Baarman et al. |
| 2009/0212765 A1 | 8/2009 | Doogue et al. |
| 2009/0251134 A1 | 10/2009 | Uenoyama |
| 2009/0278711 A1 | 11/2009 | Lohberg et al. |
| 2010/0026279 A1 | 2/2010 | Vig et al. |
| 2010/0211347 A1 | 8/2010 | Friedrich et al. |
| 2011/0018533 A1 | 1/2011 | Cesaretti et al. |
| 2011/0043197 A1 | 2/2011 | Trontelj |
| 2011/0048102 A1 | 3/2011 | Fernandez et al. |
| 2011/0074016 A1 | 3/2011 | Narita |
| 2011/0133732 A1 | 6/2011 | Sauber |
| 2011/0298448 A1 | 12/2011 | Foletto et al. |
| 2012/0274314 A1 | 1/2012 | Cesaretti et al. |
| 2012/0313635 A1 | 12/2012 | Daubert |
| 2013/0046488 A1 | 2/2013 | Donovan et al. |
| 2013/0214774 A1 | 8/2013 | Cesaretti et al. |
| 2013/0265036 A1 | 10/2013 | Friedrich et al. |
| 2013/0300406 A1 | 11/2013 | Pepka et al. |
| 2014/0184200 A1 | 7/2014 | Milano et al. |
| 2014/0266181 A1 | 9/2014 | Milano et al. |
| 2016/0025820 A1 * | 1/2016 | Scheller ............ G01R 23/005 324/207.25 |
| 2017/0219662 A1 | 8/2017 | Prentice et al. |
| 2018/0088184 A1 * | 3/2018 | Scheller ............ G01D 5/24476 |
| 2018/0367073 A1 | 12/2018 | Haas |

FOREIGN PATENT DOCUMENTS

| | | |
|---|---|---|
| DE | 19634714 A1 | 3/1998 |
| DE | 19911774 A1 | 12/1999 |
| DE | 10 2006 037 226 A1 | 2/2008 |
| DE | 10 2007 041 230 B3 | 4/2009 |
| EP | 0289414 A2 | 11/1988 |
| EP | 0289414 A3 | 11/1988 |
| EP | 0357013 A2 | 3/1990 |
| EP | 0357013 A3 | 3/1990 |
| EP | 1637898 A1 | 3/2006 |
| EP | 1679524 A1 | 7/2006 |
| EP | 1850143 A1 | 10/2007 |
| EP | 2 211 147 A1 | 7/2010 |
| GB | 2276727 A | 10/1994 |
| JP | H 06-26968 | 2/1994 |
| JP | 1998-190421 W | 7/1998 |
| WO | WO 9602849 A1 | 2/1996 |
| WO | WO 2004/072672 | 8/2004 |
| WO | WO 2006/056829 | 6/2006 |
| WO | WO 2007/138508 A1 | 12/2007 |
| WO | WO 2008/048379 A1 | 4/2008 |
| WO | WO 2009/012006 A1 | 1/2009 |
| WO | WO 2009/108422 A2 | 9/2009 |
| WO | WO 2009/108422 A3 | 9/2009 |

(56) References Cited

FOREIGN PATENT DOCUMENTS

| WO | WO 2010/096367 A1 | 8/2010 |
|---|---|---|
| WO | WO 2011/011479 | 1/2011 |
| WO | WO 2012/164915 A2 | 12/2012 |

OTHER PUBLICATIONS

U.S. Appl. No. 62/384,781, filed Sep. 8, 2016, Prentice et al.
U.S. Appl. No. 16/715,492, filed Dec. 16, 2019, Towne, et al.
Allegro MicroSystems LLC "A1140, A1142, and A1143 Datasheet, Sensitive Two-Wire Chopper-Stabilized Unipolar Hall-Effect Switches"; 10 pages.
Allegro MicroSystems LLC "A1230 Datasheet, Ultra-Sensitive Dual-Channel Quadrature Hall-Effect Bipolar Switch" 2010; 16 pages.
Allegro MicroSystems LLC "A19350 Datasheet, High Accuracy GMR Wheel Speed and Direction Sensor IC", Nov. 16, 2018, 14 pages.
Allegro MicroSystems LLC "A3211 and A3212 Datasheet, Micropower, Ultrasensitive Hall-Effect Switches" Feb. 27, 2017; 13 pages.
Allegro MicroSystems LLC "A3425 Datasheet, Ultra-Sensitive Dual-Channel Quadrature Hall-Effect Bipolar Switch" 2005-2010; 21 pages.
Allegro MicroSystems, LLC "ACS710 Datasheet, 120 kHz Bandwidth, High Voltage Isolation Current Sensor with Integrated Overcurrent Detection", 2007, 18 pages.
Allegro MicroSystems, LLC Product Information of "Ring Magnet Speed Sensing for Electronic Power Steering" 2009; 4 pages.
Ausserlechner "Compensation of the Piezo-Hall Effect in Integrated Hall Sensors on (100)-Si;" IEEE Sensors Journal, vol. 7, No. 11; Nov. 2007; ISBN: 1530-437X; 8 pages.
Ausserlechner "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; 4 pages.
Ausserlechner "Limits of Offset Cancellation by the Principle of Spinning Current Hall Probe;" Proceedings of IEEE Sensors; Oct. 2004; 4 pages.
Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 pages.
Bahreyni "A Resonant Micromachined Magnetic Field Sensor;" IEEE Sensors Journal; vol. 7, No. 9, Sep. 2007; 9 pages.
Barrettino "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 pages.
Baschirotto "Development and Analysis of PCB Vector 2-D Magnetic Field Sensor System for Electronic Compass;" IEEE Sensors Journal vol. 6, No. 2; Apr. 2006; 7 pages.
Bilotti "Monolithic Magnetic Hall Sensor Using Dynamic Quadrature Offset Cancellation;" Product Description Technical Paper STP97-10, 8 pages.
Demierre "Reference Magnetic Actuator for Self-Calibration of a Very Small Hall Sensor Array;" Sensors and Actuators A97-98; 2002; 8 pages.
Frick "CMOS Microsystem for AC Current Measurement with Galvanic Isolation;" IEEE Sensors Journal; vol. 3, No. 6; Dec. 2003; 9 pages.
Halg "Piezo-Hall Coefficients of n-Type Silicon;" Journal of Applied Physics; vol. 64, No. 1; Jul. 1, 1988; 7 pages.
Hosticka "CMOS Sensor Systems;" Sensors and Actuators A66; Apr. 1998; 7 pages.
Kanda "The Piezo-Hall Effect in n-Silicon;" 22nd International Conference on the Physics of Semiconductors; vol. 1, Jan. 1995; 4 pages.
Krammerer "A Hall effect sensors network insensitive to mechanical stress;" Proceedings of IEEE Sensors, vol. 3, Oct. 2004; 4 pages.
Mangnani "Mechanical Stress Measurement Electronics Based on Piezo-Resistive and Piezo-Hall Effects;" 9th International Conference on Electronics, Circuits and Systems 2002; vol. 1; SBN: 0-7803-7596-3; Dec. 2002; 4 pages.
Manic "Drift in Silicon Integrated Sensors and Circuits Due to the Thermo-Mechnical Stresses;" Lausanne, Ecole Polytechnique Federale De Lausanne 2000; Part 1, 74 pages.
Manic "Drift in Silicon Integrated Sensors and Circuits Due to the Thermo-Mechnical Stresses;" Lausanne, Ecole Polytechnique Federale De Lausanne 2000; Part 2, 102 pages.
Manic "Short and Long-Term Stability Problems of Hall Plates in Plastic Packages;" IEEE 38th Annual International Reliability Physics Symposium; Apr. 2000; 6 pages.
Motz "A Chopped Hall Sensor with Small Jitter and Programmable "True Power-On" Function;" IEEE Journal of Solid-State Circuits; vol. 40, No. 7; Jul. 2005; 8 pages.
Motz "An Integrated Hall Sensor Platform Design for Position, Angle and Current Sensing;" IEEE Sensors 2006; Exco, Daegu, Korea / Oct. 22-25, 2006; 4 pages.
Motz "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; 7 pages.
Munter "A Low-offset Spinning-current Hall Plate;" Sensors and Actuators A21-A23; 1990; 4 pages.
Munter "Electronic Circuitry for a Smart Spinning-current Hall Plate with Low Offset;" Sensors and Actuators A; Jun. 1991; 5 pages.
Partin "Temperature Stable Hall Effect Sensors;" IEEE Sensors Journal, vol. 6, No. 1; Feb. 2006; 5 pages.
Pastre "A Hall Sensor Analog Front End for Current Measurement with Continuous Gain Calibration;" IEEE Sensors Journal; vol. 7, No. 5; May 2007; 8 pages.
Pastre "A Hall Sensor-Based Current Measurement Microsystem With Continuous Gain Calibration;" Research in Microelectronics and Electronics, IEEE vol. 2; Jul. 25; 2005; ISBN: 0-7803-9345-7; 4 pages.
Popovic "Sensor Microsystems;" Proc. 20th International Conference on Microelectronics (MWIL 95); vol. 2, NIS, Serbia, Sep. 12-14, 1995; 7 pages.
Randhawa; "Monolithic Integrated Hall Devices in Silicon Circuits;" Microelectronics Journal; vol. 12, No. 6; Sep. 14-17, 1981; 6 pages.
Ruther et al.; "Integrated CMOS-Based Sensor Array for Mechanical Stress Mapping;" 5th IEEE Conference on Sensors, Oct. 2006; 4 pages.
Ruther et al.; "Theromagnetic Residual Offset in Integrated Hall Plates;" IEEE Sensors Journal; vol. 3, No. 6; Dec. 2003; 7 pages.
SAE International Surface Vehicle Information Report SAE J2716; SENT-Single Edge Nibble Transmission for Automotive Applications; Jan. 2010; 56 pages.
Sargent; "Switched-capacitor IC controls feedback loop;" EDN; Design Ideas; Feb. 17, 2000; 2 pages.
Schneider; "Temperature Calibration of CMOS Magnetic Vector Probe for Contactless Angle Measurement System," IEDM 1996, 4 pages.
Schott "CMOS Single-Chip Electronic Compass with Microcontroller;" IEEE Journal of Solid-State Circuits; vol. 42, No. 12; Dec. 2007; 11 pages.
Schott "Linearizing Integrated Hall Devices;" 1997 International Conference on Solid-State Sensors and Actuators, Jun. 16-19, 1997; 4 pages.
Simon "Autocalibration of Silicon Hall Devices;" 8th International Conference on Solid-State Sensors and Actuators; vol. 2; Jun. 25, 1995; 4 pages.
Steiner "Double-Hall Sensor with Self-Compensated Offset;" International Electron Devices Meeting; Dec. 7, 1997; ISBN: 0-7803-4100-7; 4 pages.
Steiner Offset Reduction in Hall Devices by Continuous Spinning Current Method; Sensors and Actuators A66; 1998; 6 pages.
Stellrecht Characterization of Hygroscopic Swelling Behavior of Mold Compounds and Plastic Packages; IEEE Transactions on Components and Packaging Technologies; vol. 27, No. 3; Sep. 2004; 8 pages.

(56) References Cited

OTHER PUBLICATIONS

Tian "Multiple Sensors on Pulsed Eddy-Current Detection for 3-D Subsurface Crack Assessment;" IEEE Sensors Journal, vol. 5, No. 1; Feb. 2005; 7 pages.
Trontelj "CMOS Integrated Magnetic Field Source Used as a Reference in Magnetic Field Sensors on Common Substrate;" WEP 1-6; IMTC; May 1994; 3 pages.
Wu "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 pages.
Zou "Three-Dimensional Die Surface Stress Measurements in Delaminated and Non-Delaminated Plastic Packages;" 48th Electronic Components and Technology Conference; May 25, 1998; 12 pages.
PCT Search Report and Written Opinion dated Oct. 23, 2009 for PCT Application No. PCT/US2009/031776 20 pages.
PCT International Preliminary Report on Patentability and Written Opinion dated Sep. 10, 2010 for PCT Application No. PCT/US2009/031776; 10 pages.
Letter to NTD with instructions to file Response to Official Action; dated Dec. 11, 2012; for Chinese Application No. 200980106535.4; 3 pages.
Letter from NTD Patent enclosing Response to Official Action dated Jan. 19, 2013 for Chinese Application No. 200980106535.4; 13 pages.
Notice of Allowance dated Feb. 11, 2011 for U.S. Appl. No. 12/037,393; 8 pages.
U.S. Appl. No. 12/037,393, filed Feb. 26, 2008, Michael C. Doogue, et al..
U.S. Appl. No. 12/959,672, filed Dec. 3, 2010, Michael C. Doogue, et al.
Office Action dated Feb. 2, 2011 from U.S. Appl. No. 12/959,672; 8 pages.
Notice of Allowance dated Jul. 19, 2011 for U.S. Appl. No. 12/959,672; 7 pages.
PCT Search Report and Written Opinion dated Aug. 11, 2010 for PCT Application No. PCT/US2010/024256; 14 pages.
PCT International Preliminary Report on Patentability and Written Opinion dated Sep. 1, 2011 for PCT Application No. PCT/US2010/024256; 9 pages.
Preliminary Amendment filed on Oct. 5, 2010 for U.S. Pat. U.S. Appl. No. 12/706,318; 11 pages.
Office Action dated Jul. 6, 2012; for U.S. Appl. No. 12/706,318; 8 pages.
Notice of Allowance dated Dec. 10, 2012 for U.S. Appl. No. 12/706,318, 6 pages.
Office Action dated Sep. 11, 2012 from U.S. Appl. No. 12/840,324; 17 pages.
Response filed on Dec. 11, 2012 to Office Action dated Sep. 11, 2012 for U.S. Appl. No. 12/840,324, 15 pages.
Final Office Action dated Feb. 12, 2013 for U.S. Appl. No. 12/840,324, 16 pages.
U.S. Appl. No. 12/840,324, filed Jul. 21, 2010, Juan Manuel Cesaretti, et al.
PCT Search Report and Written Opinion dated Sep. 27, 2010 for PCT Application No. PCT/US2010/042694; 16 pages.
PCT International Preliminary Report on Patentability and Written Opinion dated Feb. 2, 2012; for PCT Patent Application No. PCT/US2010/042694; 11 pages.
EP Official Communication; dated Feb. 23, 2012; for EP. Pat. App. No. 10739429.8; 2 pages.
European Response to Written Opinion dated Sep. 4, 2012 for European Patent Application No. 10739429.8, 21 pages.
European Notice of Allowance; dated Jan. 4, 2013; for European Pat. App. No. 10739429.8; 7 pages.
PCT Search Report and Written Opinion dated Jun. 22, 2012 for PCT Pat. App. No. PCT/US2012/032315; 18 pages.
U.S. Appl. No. 13/095,371, filed Apr. 27, 2011, Juan Manuel Cesaretti, et al.
Invitation to Pay Additional Fees and, Where Applicable, Protest Fee, PCT/US2013/071648, dated Apr. 3, 2014, 7 pages.
PCT Search Report and Written Opinion dated Jul. 23, 2014 for PCT Application No. PCT/US2013/071648; 23 pages.
PCT International Preliminary Report on Patentability dated Jul. 9, 2015 PCT Application No. PCT/US2013/071648; 15 pages.
Office Action dated Mar. 19, 2015 for U.S. Appl. No. 13/730,100; 19 pages.
Response to Office Action filed on Aug. 24, 2015 for U.S. Appl. No. 13/730,100; 16 pages.
Final Office Action dated Dec. 4, 2015; For U.S. Appl. No. 13/730,100; 12 pages.
Response to Final Office Action filed Feb. 29, 2016 for U.S. Appl. No. 13/730,100; 6 pages.
Notice of Allowance dated Mar. 29, 2016 for U.S. Appl. No. 13/730,100; 9 pages.
Response to Office Action filed Feb. 29, 2016 for European Application No. 13812244.5; 22 pages.
Examination Report dated May 8, 2019 for European Application No. 13812244.5; 8 pages.
Response to Examination Report filed on Sep. 6, 2019 for European Application No. 13812244.5; 11 pages.
Intention of Grant dated Oct. 11, 2019 for European Application No. 13812244.5; 7 pages.
Korean Office Action dated Apr. 26, 2019 for Korean Application No. 10-2015-7019972; 15 pages.
Response to Korean Office Action filed on May 29, 2019 for Korean Application No. 10-2015-7019972; 22 pages.
Notice of Allowance dated Aug. 17, 2019 for Korean Application No. 10-2015-7019972; 2 pages.
Invitation to Pay Fees dated Jun. 10, 2015 For PCT Application No. PCT/US2014/071825; 7 pages.
PCT Search Report and the Written Opinion dated Oct. 8, 2015 for PCT Application No. PCT/US2014/071825; 20 pages.
International Preliminary Report on Patentability dated Jun. 28, 2016 for PCT Application No. PCT/US2014/071825; 14 pages.
European Extended Search Report dated Jun. 29, 2017 for European Pat. App. No. 17158006.1; 7 pages.
Response to European Communication filed on Jan. 31, 2018 for European Pat. App. No. 17158006.1; 17 pages.
Office Action dated Jul. 6, 2016 for U.S. Appl. No. 14/578,813; 14 pages.
Response to Office Action filed on Nov. 4, 2016 for U.S. Appl. No. 14/578,813; 15 pages.
Final Office Action dated Feb. 27, 2017 for U.S. Appl. No. 14/578,813; 10 pages.
Response to Final Office Action filed on May 30, 2017 for U.S. Appl. No. 14/578,813; 11 pages.
Notice of Allowance dated Sep. 12, 2017 for U.S. Appl. No. 14/578,813; 18 pages.
European Examination Report dated Dec. 10, 2020 for European Application No. 17158006.1; 4 Pages.
Response to European Examination Report dated Dec. 10, 2020 for EP Application No. 17158006.1; Response Filed Apr. 7, 2021; 12 Pages.
Search Report dated Jan. 15, 2016 for PCT Application No. PCT/US2015/051315; 18
Japanese Office Action dated Mar. 9, 2021 with English translation for Japanese Application No. 2020-075918; 10 pages

* cited by examiner

DIAGNOSTIC CIRCUITS AND METHODS FOR SENSOR TEST CIRCUITS

CROSS-REFERENCE TO RELATED APPLICATIONS

Not Applicable.

STATEMENT REGARDING FEDERALLY SPONSORED RESEARCH

Not Applicable.

FIELD

This invention relates generally to sensors and, more particularly, to diagnostic circuits and methods for sensor test circuits.

BACKGROUND

As is known, sensors are used to perform various functions in a variety of applications. Some sensors include one or magnetic field sensing elements, such as a Hall effect element or a magnetoresistive element, to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, a current sensor that senses a magnetic field generated by a current flowing in a current conductor, and an angle sensor that senses an angle of a magnetic field. Magnetic field sensors are widely used in automobile control systems, for example, to detect ignition timing from a position of an engine crankshaft and/or camshaft, and to detect a position and/or rotation of an automobile wheel for anti-lock braking systems.

During manufacture and/or during use in an application, sensors sometimes experience failures. These failures may be due to manufacturing defects, design defects, latent failures, or a combination of both as examples.

Sensor integrated circuits are widely used in automobile control systems and other safety critical applications. There are a variety of specifications that set forth requirements related to permissible sensor quality levels, failure rates, and overall functional safety. For example, some automotive applications require conformity to Automotive Safety Integrity Level (ASIL) standards. One approach to meeting such mandates has been to use redundant, identical circuits in a sensor integrated circuit. Another approach is to test parts during and after the manufacturing process. For example, some parts include self-test capabilities, i.e., internal circuitry that can be used by the part to test itself. These self-tests may include built-in self-tests (i.e., "BIST" tests) and can be used to test various aspect of the sensor circuitry.

SUMMARY

According to the disclosure, a sensor includes a detector configured to sense a parameter, at least one test circuit configured to detect a respective fault condition of the sensor and generate a fault signal in response to detecting the fault condition, a checker configured to test the at least one test circuit to determine the operational status of the at least one test circuit, and an output signal generator. The output signal generator can be coupled to receive the sensed parameter, the fault signal, and the operational status of the at least one test circuit, and generate an output signal of the sensor to communicate the sensed parameter and the operational status of the at least one test circuit.

With this arrangement, the checker performs diagnostics on the sensor test circuit(s) and provides an indication of the operational status of the test circuit(s) so that appropriate action can be taken. Stated differently, the safety checking circuits themselves (i.e., the test circuits) are tested and their operational status (i.e., whether the test circuits are or are not operating properly, such as to within a predetermined specification) is communicated by the sensor output signal to external circuits or systems to provide a so-called "check of the checks".

Features may include one or more of the following individually or in combination with other features. The test circuit can include a threshold and the checker can be configured to test the test circuit by inputting a value to the test circuit that is greater than or less than the threshold. The checker can be configured to mask the fault signal generated by the test circuit prior to testing the test circuit. For example, the checker can be configured to mask the fault signal generated by the test circuit for a predetermined duration after sensor start up. The checker can be configured to un-mask the fault signal of the test circuit after testing the test circuit. The checker can be configured to store the operational status of the test circuit in a memory. The sensor can transition to a safe mode of operation in response to the fault signal detecting the fault condition. Further, the sensor can transition to a safe mode of operation when the operational status of the test circuit is faulty. The safe mode can include reducing an amount of current consumed by the sensor below a predetermined value.

The output signal generator can be configured to generate the sensor output signal including a pulse having a first width when the operational status of the test circuit is not faulty and a second width when the operational status of the test circuit is faulty, wherein the second width is different than the first width. The output signal generator can be configured to generate the sensor output signal including a pulse having a first amplitude when the operational status of the test circuit is not faulty and a second amplitude when the operational status of the test circuit is faulty, wherein the second amplitude is different than the first amplitude. The output signal generator can be configured to generate the sensor output signal including one of an increasing amplitude or a decreasing amplitude when the operational status of the test circuit is not faulty and including the other one of the increasing amplitude or the decreasing amplitude when the operational status of the test circuit is faulty. In some embodiments, the increasing amplitude includes a monotonically increasing amplitude and the decreasing amplitude includes a monotonically decreasing amplitude. In some embodiments, the increasing amplitude includes a non-monotonically increasing amplitude and the decreasing amplitude includes a non-monotonically decreasing amplitude. The checker can be configured to test the test circuit to determine the operational status of the test circuit during a start up mode of operation. The checker can be configured to test the test circuit to determine the operational status of the test circuit periodically during a normal mode of operation. The detector can be configured to generate a detector output signal including a speed pulse and the output signal of the sensor can include the speed pulse and an operational status pulse following the speed pulse, wherein the operational status pulse is indicative of the operational status of the test circuit. The operational status pulse can have a first amplitude when the operational status of the test circuit is not faulty and a second amplitude when the operational status of the test circuit is faulty, wherein the first amplitude is different than the second amplitude. The detector can be configured to generate a detector output signal including a standstill pulse and the output signal of the sensor can include the standstill pulse and an operational status pulse following the standstill pulse, wherein the operational status pulse is indicative of the operational status of the test circuit. The operational status pulse can have a first width when the operational status of the test circuit is not faulty and a second width when the operational status of the test circuit is faulty, wherein the first width is different than the second width. The sensor can include one or more magnetic field sensing elements and the sensed parameter can include one or both of a speed of motion of a target or a direction of motion of the target. The detector can further include an oscillator having an operating frequency, a voltage regulator configured to generate a regulated voltage, an analog signal path to process an analog signal generated by the one or more magnetic field sensing elements, an analog-to-digital converter configured to convert the analog signal into a digital signal, a digital processor configured to process the digital signal, and a memory, and the test circuit can be configured to detect one or more of a fault condition of the operating frequency of the oscillator, the regulated voltage, a voltage range of the analog signal, an input range of an analog-to-digital converter, the digital processor, and a parity of the memory.

Also described is a method including sensing a parameter with a detector, detecting a fault condition of the sensor with at least one test circuit, testing the at least one test circuit to determine an operational status of the at least one test circuit, and generating an output signal including the parameter and the operational status of the at least one test circuit.

Features may include one or more of the following individually or in combination with other features. Sensing the parameter can include one or both of sensing a speed of motion of a target or sensing a direction of motion of the target. Generating the output signal can include encoding the operational status of the at least one test circuit with one or more of a signal pulse width or amplitude. The method can further include ignoring a result of detecting the fault condition prior to testing the at least one test circuit.

According to a further aspect, a sensor includes a detector configured to sense a parameter, at least one test circuit configured to detect a respective fault condition of the detector and generate a fault signal in response to detecting the fault condition, a checker configured to test the at least one test circuit to determine the operational status of the at least one test circuit, and means, coupled to receive the sensed parameter, the fault signal, and the operational status of the at least one test circuit, for generating an output signal of the sensor to communicate the sensed parameter and the operational status of the at least one test circuit.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
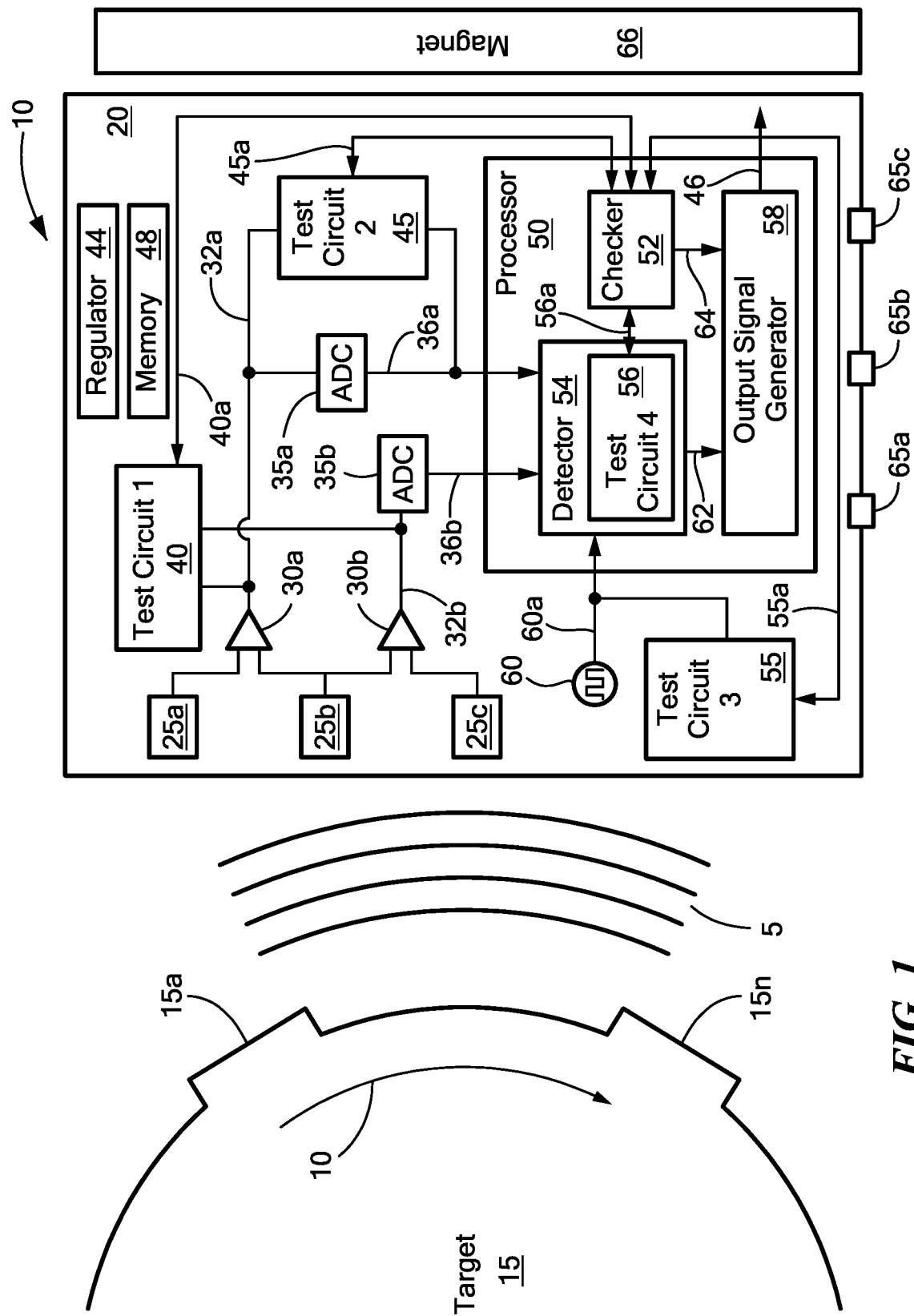
FIG. 1 is a block diagram of a magnetic field sensor implementing diagnostics for test circuits according to the disclosure.

Before describing the present invention, some introductory concepts and terminology are explained. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector. A rotation detector can sense rotation of an object, for example, advance and retreat of magnetic domains of a ring magnet or advance and retreat of gear teeth of a ferromagnetic gear. The term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. The circuits and techniques described herein apply to any magnetic field sensor capable of detecting a magnetic field.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Referring to FIG. 1, a sensor system 10 includes a magnetic field sensor 20 having a detector 54 configured to sense a parameter associated with a target 15, at least one test circuit 40, 45, 55, 56 configured to detect a respective fault condition of the sensor and generate a fault signal in response to detecting the fault condition, a checker 52 configured to test the at least one test circuit to determine the operational status of the at least one test circuit and an output signal generator 58. The output signal generator 58 can be coupled to receive the sensed parameter, the fault signal, and the operational status of the at least one test circuit, and generate an output signal 46 of the sensor to communicate the sensed parameter and the operational status of the at least one test circuit.

With this arrangement, the checker 52 performs diagnostics on the sensor test circuit(s) and provides an indication of the operational status of the test circuit(s) so that appropriate action can be taken. Stated differently, the safety checking circuits themselves (i.e., the test circuits 40, 45, 55, 56) are tested and their operational status (e.g., whether the test circuits are or are not operational generally and/or operational to within a predetermined specification) is communicated by the sensor output signal 46 to external circuits or systems to provide a so-called "check of the checks".

The magnetic field sensor 20 includes one or more magnetic field sensing elements 25a, 25b, 25c configured to sense a magnetic field 5 associated with the target 15 and generate a respective magnetic field signal indicative of the sensed magnetic field. For example, the magnetic field 5 can be affected by movement (e.g., rotation) of the target 15.

Target 15 can have a variety of forms, including, but not limited to a gear having gear teeth 15a-15n or a ring magnet having one or more pole pair. Also, linear arrangements of ferromagnetic objects that move linearly are possible. In the example embedment of FIG. 1, magnetic field sensor 20 may take the form of a rotation detector to detect passing gear teeth, for example, gear teeth of a ferromagnetic gear or, more generally to detect target object 15. A permanent magnet 66 can be placed at a variety of positions proximate to the target, resulting in fluctuations of the magnetic field as the gear rotates in a so-called "back-bias" arrangement. Features of the target 15 are spaced from the sensing elements 25a-25c by an airgap. Although intended to be fixed once the sensor 20 is in place in a particular application, airgap can vary for a variety of reasons.

In the illustrated differential configuration, magnetic field sensing elements 25a, 25b generate respective magnetic field signals coupled to inputs of a differential amplifier 30a. The output signal 32a of amplifier 30a is thus indicative of a position of target 15 relative to elements 25a, 25b. Magnetic field sensing element 25c generates a respective magnetic field signal that, along with the output of sensing element 25b, is coupled to inputs of a differential amplifier 30b. The output signal 32b of amplifier 30b is thus indicative of a position of target 15 relative to elements 25b, 25c. Sensing elements 25a, 25b, 25c can take a variety of forms, such as Hall effect elements or MR elements as non-limiting examples. The magnetic field sensing elements 25a, 25b, 25c may be arranged in one or more bridge or other configurations in order to generate one or more single-ended or differential signals indicative of the sensed magnetic field.

The output signals 32a, 32b of amplifiers 30a, 30b can be coupled to a respective processing channel as can include an analog-to-digital converter (ADC) 35a, 35b, respectively. Output signals of the amplifiers 30a, 30b can be gain and offset adjusted. The ADCs 35a, 35b can take various forms and may include one or more filters, such as a low pass filter and/or notch filter, and as may take the form of a sigma delta modulator to generate respective digital magnetic field signals 36a, 36b.

The output signals 36a, 36b of the ADCs 35a, 35b can be coupled to a digital processor, or controller 50 for processing by detector 54. For example, in some embodiments, detector 54 can be configured to process the signals 36a, 36b in order to detect speed, position, and/or direction of movement, such as rotation, of target 15 and generate one or more digital signals 62 for coupling to output signal generator 58. More particularly, controller 50 determines the speed, position, and/or direction of target 15 based on the magnetic field signals 36a, 36b and can combine this information with fault or other diagnostic information in some embodiments to generate the sensor output signal 46.

Detector 54 can be configured to generate the sensor output signal 46 based on a comparison of one or both digital magnetic field signals 36a, 36b to a threshold value. More particularly, the detector output signal 62 can include transitions occurring at switch points having a predetermined relationship with respect to a digital magnetic field signal 36a, 36b crossing the threshold value. The detector output signal 62 can be a binary, two-state signal having transitions or pulses at the switch points for example. Movement speed of the target 15 can be detected based on the frequency of the binary signal.

Various schemes are possible for generating the threshold value. In some embodiments, the detector 54 tracks positive and negative peaks of one or both digital magnetic field signals 36a, 36b and generates the threshold value as a percentage of the difference between the positive and negative peaks (i.e., as a percentage of the peak-to-peak magnetic field signals). Other threshold values are also possible.

A direction of rotation of the target 15 can be determined in embodiments containing multiple sensing elements 25a, 25b, 25c and respective processing channels as shown, which processing channels are configured to generate phase separated magnetic field signals 32a, 32b (as are sometimes referred to as channel signals) or digital versions 36a, 36b of the signals. In this example, the direction of rotation can be determined based on a relative phase or relative time difference (e.g., lag or lead) of a particular edge transition of the phase separated magnetic field signals 36a, 36b.

The output signal generator 58 can provide the sensor output signal 46 in various formats, such as a so-called two-wire output format in which the output signal is provided in the form of current pulses on the power connection to the sensor or a three-wire output format in which the output signal is provided at a separate dedicated output connection. Terminals of the sensor 20 (as can take the form of pins in the case of an integrated circuit sensor) include a power terminal 65a and a ground terminal 65b. In a two-wire output, the sensor output signal 46 is superimposed on the power and ground terminals 65a, 65b (e.g., in the form of current pulses). In a three-wire output, the sensor output signal 46 is provided on an additional, dedicated output terminal 65c that is separate from the power and ground terminals 65a, 65b. Sensor output terminals 65a, 65b, 65c can be coupled to external circuits and systems (e.g., an automotive computer or engine control unit) that respond to the communicated information according to system design and requirements.

Additional features of the sensor 20 can include a memory device 48, as may take the form of an EEPROM, and an oscillator 60 that provides an oscillating output 60a. Memory 48 can be used to store values associated with sensor functionality, including but not limited to storing the operational status of one or more test circuits. Oscillator 60 may be non-crystal oscillator circuit (or a crystal oscillator circuit) and oscillating output 60a may be used as a clock signal. A regulator 44 can provide power to the sensor circuitry and may include an analog regulator to power analog circuitry of the sensor and a digital regulator to power digital circuitry of the sensor.

Test circuits 40, 45, 55, 56 are configured to detect a respective fault condition of the sensor and generate respective fault signals (as may be carried by signals lines 40a, 45a, 55a, 56a) in response to detecting the fault condition. For example, test circuit 40 can be configured to test the speed and direction detection functions of magnetic field sensor 20, test circuit 45 can be configured to test the ADC functions of magnetic field sensor 20, test circuit 55 can be configured to test the oscillator functions of magnetic field sensor 20, and test circuit 56 can be configured to test memory data integrity and digital circuit functionality. Test circuits 40, 45, 55, 56 are described below and also in U.S. Pat. No. 9,851,416 entitled "Systems and Methods for Magnetic Field Sensors with Self-Test" which patent is assigned to the Assignee of the subject application and hereby incorporated herein by reference in its entirety. Additionally or alternatively, sensor 20 may include IDDQ and/or BIST test circuitry to test magnetic field sensor 20 to determine if there are any current leakage paths. As another example, the regulated voltage from regulator 44 can be monitored to determine if the voltage is within a specified range. It will be appreciated that test circuits 40, 45, 55, 56 are example test circuits and fewer or more test circuits to test other sensor fault conditions can be provided.

The checker 52 is configured to test the test circuits 40, 45, 55, 56 to determine their operational status generally by overriding the test circuits and forcing them out of a specified range in order to thereby mimic a fault. The checker 52 can test the test circuits 40, 45, 55, 56 once or more than once and at various times. For example, in some embodiments, the testing is performed, and the test circuit operational status is communicated, during a power on, or start up diagnostic sequence (see, e.g., FIGS. 3A, 3B, 4A, 4B, 4C, 4D, 5A, 5B, 5C, and 5D) and this can be the only testing performed. Alternatively or additionally, the testing and communication of the operational status can be performed during normal operation of the part (see, e.g., FIGS. 6A, 6B, 6C, 6D and 7). It will be appreciated that power on diagnostics can be performed in a manufacturing setting or when the part 20 is in situ (i.e., installed in the actual application for which it is designed).

Test circuit 40 can monitor analog magnetic field signals 32a, 32b to determine if their voltage is within a predetermined range. In this way, it can be determined if one or more of the sensing elements 25a, 25b, 25c is disconnected. More particularly, in some embodiments, a Hall plate sensing element should be at a voltage level of one-half of the regulated voltage. If a wire breaks, this voltage will go to Vreg or to ground. Thus, detection of the level of signals 32a, 32b can be used to determine if a wire has broken. Alternatively or additionally, test circuit 40 may include a counter configured to increment and/or decrement based on digital versions of signals 32a, 32b. In this example, the test circuit 40 can flag an error condition if a count of the counter exceeds a predetermined threshold as described in U.S. Pat. No. 9,851,416.

Test circuit 45 can monitor ADC 35a to determine if the ADC is operating properly. For example, in some embodiments such as some sigma delta converters, the ADC inputs are constrained in order to prevent the inputs from reaching a positive or negative rail to avoid saturation and instability. In this case, the ADC input range can be monitored to determine if it is within a normal range. If the ADC input goes to full scale for example, then it can be determined that the ADC is not operating properly. Alternatively or additionally, test circuit 45 can test the ADC 35a by injecting a known analog test signal into an input of the ADC and comparing the resulting converted digital signal to an expected value. If the digital signal is not equal to or is not within an acceptable threshold of the expected value, the test circuit 45 can flag an error, as described in U.S. Pat. No. 9,851,416. For ease of illustration, test circuit 45 is shown coupled only to ADC 35a. Test circuit 45 may also be coupled to ADC 35b in order to check the operation of ADC 35b, or any other ADC in sensor 20.

Test circuit 55 can monitor oscillating signal 60a to determine whether oscillator 60 is operating accurately. For example, the frequency of the oscillating signal 60a can be monitored to determine if it is within a specified window of frequencies. To this end, the test circuit 55 can include a ramp generator circuit that generates a voltage ramp signal that decays over time and resets upon detection of an edge of the oscillating signal 60a. The test circuit 55 can further include a comparator to determine whether a voltage level of the ramp signal is between a predetermined voltage range upon detection of an edge of the oscillating signal 60a as described further in U.S. Pat. No. 9,851,416.

Test circuit 56 can test memory 48 and/or the digital processor 50. For example, the test circuit 56 can perform a parity check of the memory 48. Test circuit can also include circuitry such as redundant circuitry to detect errors in the digital circuitry of the processor 50.

Checker 52 is configured to test at least one test circuit 40, 45, 55, 56 to determine the operational status of the test circuit. To this end, the checker 52 is coupled to receive an output signal (referred to alternatively as a fault signal) from test circuits 40, 45, 55, 56 on respective connections 40a, 45a, 55a, 56a. In general, the fault signals provide an indication of whether a fault condition is detected by the respective test circuit.

According to the disclosure, the output signal generator 58 can be coupled to receive the sensed parameter from the detector 54, the fault signals (as may be coupled through the checker 52 to the output signal generator 58), and the operational status of the at least one test circuit as determined by the checker. The output signal generator 58 is configured to generate an output signal 46 of the sensor to communicate the sensed parameter and the operational status of the at least one test circuit. More particularly, the output signal generator 58 encodes the test circuit operational status along with the detected parameter (e.g., speed and/or direction information) and can include an output driver to generate output signal 46 at one or more output terminals or pins 65a, 65b, 65c, respectively.

Output signal generator 58 can encode the operational status of the test circuits 40, 45, 55, 56 in the output signal 46 in a variety of formats based on sensor configuration and other considerations (see, e.g., FIGS. 3A, 3B, 4A, 4B, 4C, 4D, 5A, 5B, 5C, 5D, 6A, 6B, 6C, 6D, and 7). As will become apparent, regardless of the particular format in which the test circuit operational status information is encoded, the format is distinguishable from the detected parameter (e.g., speed and/or direction information) so that it does not interfere with normal operation of communication of the detected parameter to the controller.

The output signal 46 can include the test circuit operational status regardless of whether the status is acceptable (i.e., a passing status) or faulty (i.e., a failing status) and thus, can be considered to actively acknowledge that the checker 52 is operational.

Conventionally, a fault signal generated by some test circuits would put a sensor into a safe state or safe mode of operation in which portions of the sensor are disabled, thereby reducing power consumption. For example, a conventional sensor that consumes approximately 7-14 mA in normal operation may have a safe state in which current consumption is reduced to a level on the order of 2.5-3 mA. Going into a safe state can be disruptive to system operation as significant sensor functions are disabled. It will be appreciated that in addition to the existence of an actual fault, a faulty test circuit could send a sensor into a safe state.

According to the disclosure, since the output signal 46 provides an indication of the operational status of the test circuits 40, 45, 55, 56, advantageously the sensor 20 need not automatically go into a safe state when a fault signal is generated. For example, when one or more test circuits is determined to be faulty, an external controller in communication with the sensor 20 may simply log the existence of a faulty test circuit for servicing at a convenient time, rather than causing an immediate interruption in the sensor operation.

Figure 2:
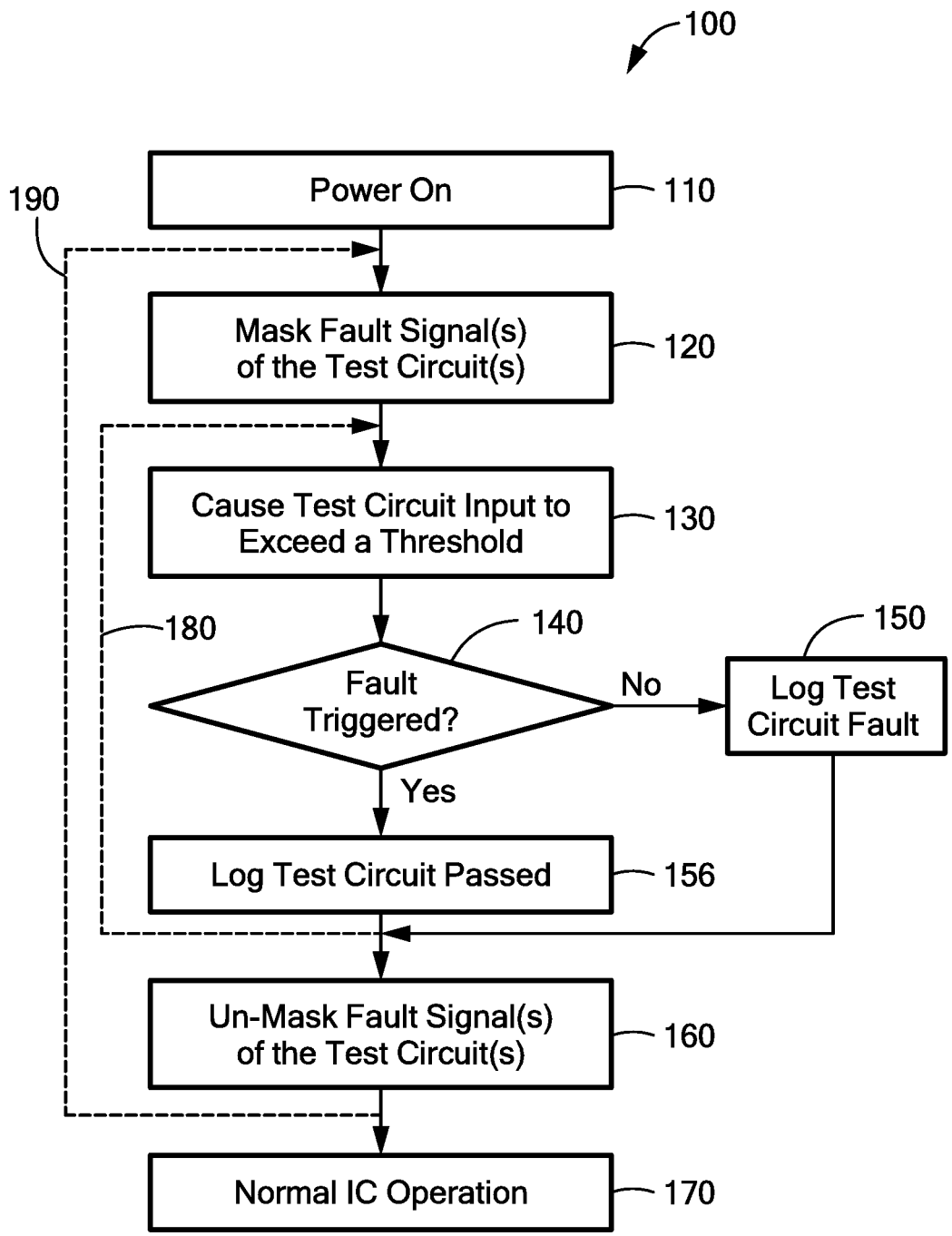
FIG. 2 is a flow diagram illustrating test circuit diagnostics according to the disclosure.

Referring also to FIG. 2, a flow diagram illustrating a test circuit diagnostic process 100 commences at block 110 when the sensor (e.g., sensor 20 of FIG. 1) is powered on. At block 120, a fault signal generated by a test circuit under test is masked (i.e., blanked or otherwise disabled or ignored) in order to prevent the fault signal from communicating a fault and putting the sensor 20 into a safe state. For example, if test circuit 40 is being tested at block 120, then the fault signal 40a is masked. Various arrangements are possible to mask a fault signal, such as using a digital switch (e.g., a logic gate or multiplexer).

At block 130, the test circuit under test is provided with an input known to exceed a threshold that would otherwise cause a fault signal to be generated. Stated differently, at this block, out of specification behavior is forced in order to mimic a fault. For example, considering a test circuit that would indicate a fault if its input is greater than or less than a predetermined threshold, the checker 52 provides an input to the test circuit (e.g., as may be carried by connections 40a, 45a, 55a, 56a) greater or less than the predetermined threshold, which input is thus expected to trigger a fault detection.

For example, if test circuit 40 is being tested, then processor 50 can provide an input signal to test circuit 40 (e.g., via signal line 40a) to replace one of the signals 32a, 32b, which input signal is knows to vary from the received one of the signals 32a, 32b by more than a predetermined amount (i.e., by more than a threshold amount). As another example, if test circuit 55 is being tested, then processor 50 can provide an input signal to test circuit 55 (e.g., via signal line 55a) to replace the oscillating signal 60a from oscillator 60, which input signal is known to have a frequency that would cause fault signal 55a to be generated. For example, an input signal with a frequency that is too high to be within the oscillator specification can be provided to the oscillator and/or an input signal with a frequency that is too low to be within the oscillator specification can be provided to the oscillator.

It will be appreciated that there are various schemes that can be used to introduce the input to a test circuit to force a fault. For example, a test circuit can include a multiplexer having one or more inputs provided by the normal operation input(s) and a diagnostic input provided by the processor 50 to mimic the fault and the processor can control which multiplexer input is coupled to the test circuitry at any given time. For example, oscillator test circuit 55 can include a multiplexer having a first input provided by the oscillating signal 60a and a second input provided by the checker 52 via signal line 55a. In normal operation, the multiplexer selects the oscillating signal 60a for fault processing and, when the checker 52 is testing the test circuit 55, the multiplexer selects the test input for fault processing.

At block 140, it is determined whether a fault is triggered. If the fault is triggered (as occurs if the test circuit is working properly), then the test circuit is determined to be working properly and this passing result of the diagnostic flagged at block 156 (i.e., the passing result can be stored in memory for communication in the sensor output signal 46).

If, on the other hand, a fault is not triggered at block 140, then the test circuit is determined to be faulty and this fault is flagged at block 150 (i.e., the failing result can be stored in memory for communication in the sensor output signal 46). If one or more test circuits is determined to be faulty, the action taken can vary depending on the particular test and/or the application. As one non-limiting example, an engine control unit receiving the output signal 46 indicating that one or more test circuits is faulty may flag that status and write to a memory to record the existence of the fault and for example that service should be sought but not necessarily immediately.

Significantly not only is a failing test result as logged at block 150 encoded in the output signal 46, but also a passing result as logged at block 156 is encoded in the output signal 46.

Following block 156, the fault signal of the test circuit under test can be "un-masked" at block 160. Normal sensor operation resumes at block 170.

The process 100 can be performed during a power up diagnostic stage of operation of the sensor and/or periodically during normal operation (as may sometimes be referred to as running mode). Thus, it will be appreciated that "normal operation" in the context of block 170 can be a running mode of operation following a power up diagnostic mode and/or following an earlier running mode operation during which test circuit diagnostics are performed.

It will be appreciated that the process 100 can be performed for each test circuit sequentially (i.e., in series) or some of all of the test circuits can be tested as an integrated process (i.e., in parallel). In other words, in sequential processing as illustrated by dotted line 190, steps 120-160 can be performed for one test circuit and thereafter these steps can be performed again for another test circuits and so forth until all of the test circuits are tested.

Alternatively, in parallel processing, each of the steps 120-160 can be performed once, but for all of the test circuits, before the process progresses to the next step. For example, in this type of processing, the fault signals from all of the test circuits are masked in block 120. Subsequently, each of the test circuits is provided with a respective input that is expected to trigger a fault at block 130. Block 140 would be applied to each of the test circuits to determine if a fault is triggered, with the test circuits having a fault being logged at block 150 and those passing the diagnostic test being logged as passing at block 156. The fault signals from all of test circuits are unmasked at block 160 and, when normal operation resumes at block 170, all of the test circuits have been tested.

It will also be appreciated that a combination of so-called parallel processing and series processing can be performed. For example, block 120 can mask the test signals for all of the test circuits and then steps 130, 140 150 and 156 can be performed for each test circuit until all test circuits are tested as illustrated by dotted line 180. Thereafter, the fault signals from all of the test circuits can be unmasked in block 160.

Referring to FIGS. 3A, 3B, 4A, 4B, 4C, 4D, 5A, 5B, 5C, and 5D, various output signal formats to communicate test circuit operational status during a diagnostic power on sequence are shown. The power on diagnostics can be performed during a predetermined interval of time following power being applied to the sensor, for example, during the first 0.5 milliseconds following power up. As noted above, formats to communicate test circuit operational status are distinguishable from formats that communicate the sensed parameter(s). If test circuit diagnostics are performed only during a power on or start up diagnostic phase of operation, then the format of communicating test circuit diagnostics can be distinguished in time from the formats that communicate the sensed parameters.

Figure 3A:
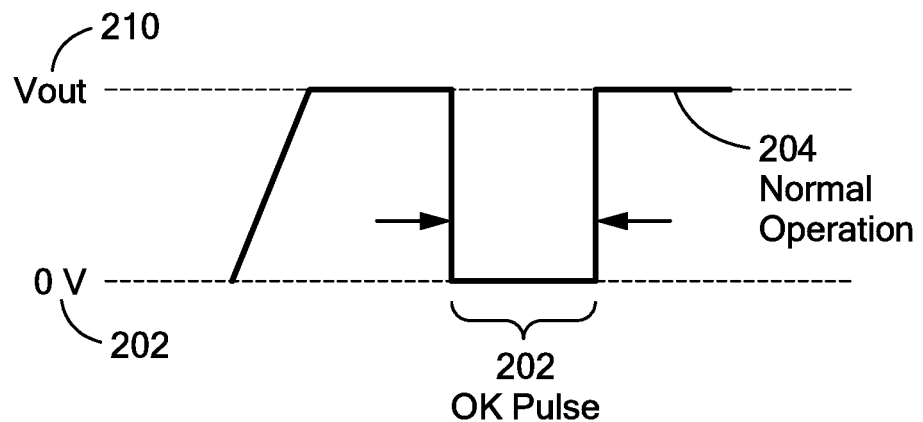
FIGS. 3A and 3B show example sensor output signals for encoding test circuit diagnostic information by voltage pulse width.
Figure 3B:
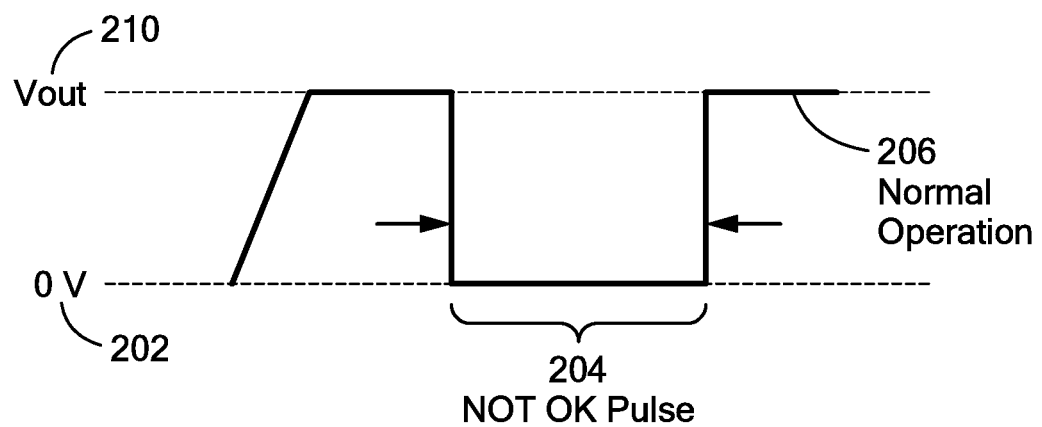

Referring to FIGS. 3A and 3B, in which the horizontal axis represents arbitrary units of time and the vertical axis represents sensor output signal level in volts, a signal format to communicate test circuit operational status for use with a three-wire output sensor during power on diagnostic operation is shown. In this example, during normal sensor operation (following the power on diagnostics), the output signal is a binary signal that can have a low level 202 (e.g., zero volts) or a high level 210 (e.g., 5 volts or other output voltage level Vout as may represent a pull up voltage through an open collector or open drain output driver for example) and the sensed parameter such as target rotational speed can be communicated by the frequency of signal transitions.

In the example signals of FIGS. 3A and 3B, test circuit operational status is communicated by pulse width. For example, a first pulse 202 having a first pulse width can indicate that the tested test circuit(s) are functioning properly (and can thus correspond to an "OK pulse") and a second pulse 204 having a second pulse width different than the first pulse width can indicate that one or more tested test circuits are faulty (and can thus correspond to a "NOT OK pulse"). While the first pulse width of pulse 202 is shown to be smaller than the second pulse width of pulse 204, it will be appreciated that the relationship between the pulse widths can be reversed. It will also be appreciated that the polarity of the signal and thus of pulses 202, 204 can be inverted. With pulses 202, 204 being provided during power on diagnostic operation, it is not required that their pulse widths be different than pulse widths used during normal operation to communicate other information (e.g., target rotational direction).

Figure 4A:
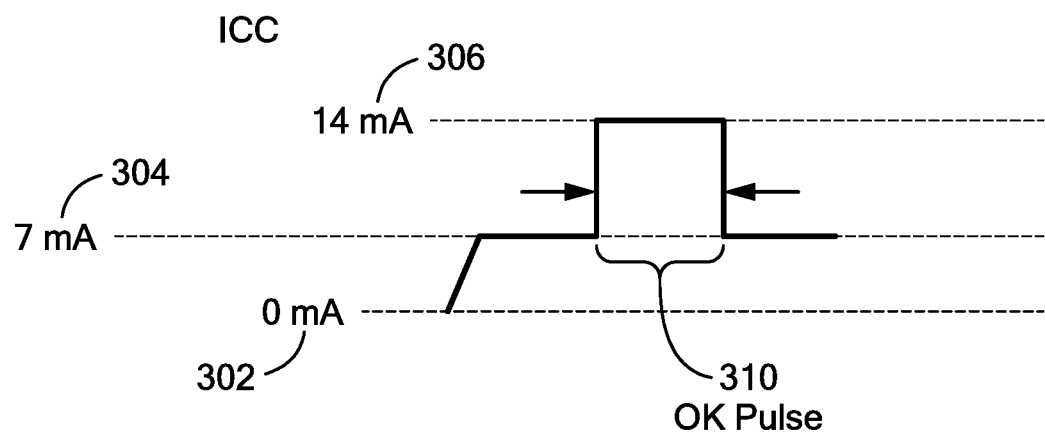
FIGS. 4A and 4B show example sensor output signals for encoding test circuit diagnostic information by current pulse width.
Figure 4B:
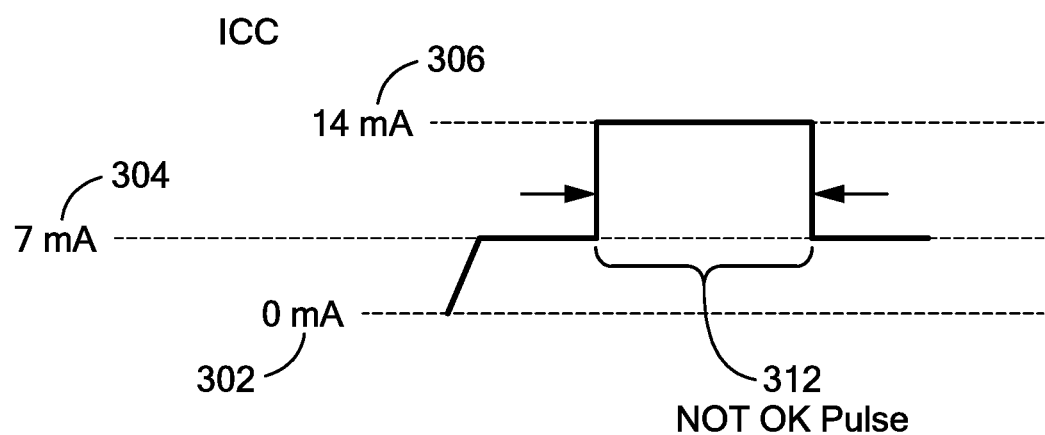

Referring also to FIGS. 4A and 4B, in which the horizontal axis represents arbitrary units of time and the vertical axis represents sensor output signal level in amperes, a signal format to communicate test circuit operational status for use with a two-wire output sensor during a power on diagnostic operation is shown. In this example, during normal sensor operation (following the power on diagnostics), the output signal can have a low level 304 (e.g., 7 mA) or a high level 306 (e.g., 14 mA) and the sensed parameter such as target rotational speed can be communicated by the frequency of signal transitions between the low and high levels.

In the example signals of FIGS. 4A and 4B, test circuit operational status is communicated by pulse width. For example, a first pulse 310 having a first pulse width can indicate that the tested test circuit(s) are functioning properly (and can thus correspond to an "OK pulse") and a second pulse 312 having a second pulse width different than the first pulse width can indicate that one or more tested test circuits are faulty (and can thus correspond to a "NOT OK pulse"). While the first pulse width of pulse 310 is shown to be smaller than the second pulse width of pulse 312, it will be appreciated that the relationship between the pulse widths can be reversed. It will also be appreciated that the polarity of the signal and thus of pulses 310, 312 can be inverted. Here again, with pulses 310, 312 being provided during a power on diagnostic operation, it is not required that their pulse widths be different than pulse widths used during normal operation to communicate other information (e.g., target rotational direction).

Figure 4C:
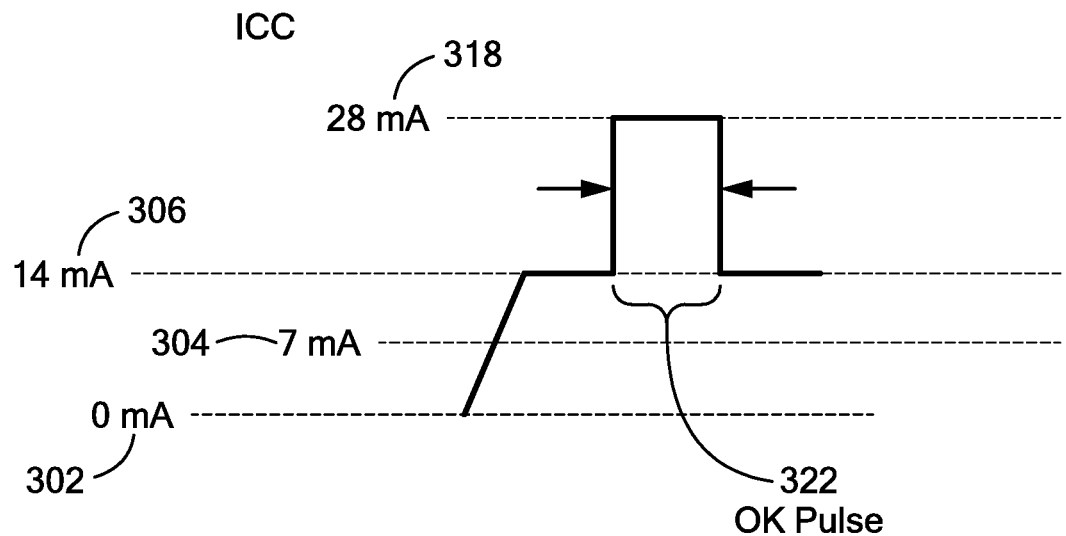
FIGS. 4C and 4D show other example sensor output signals for encoding test circuit diagnostic information by current pulse width.
Figure 4D:
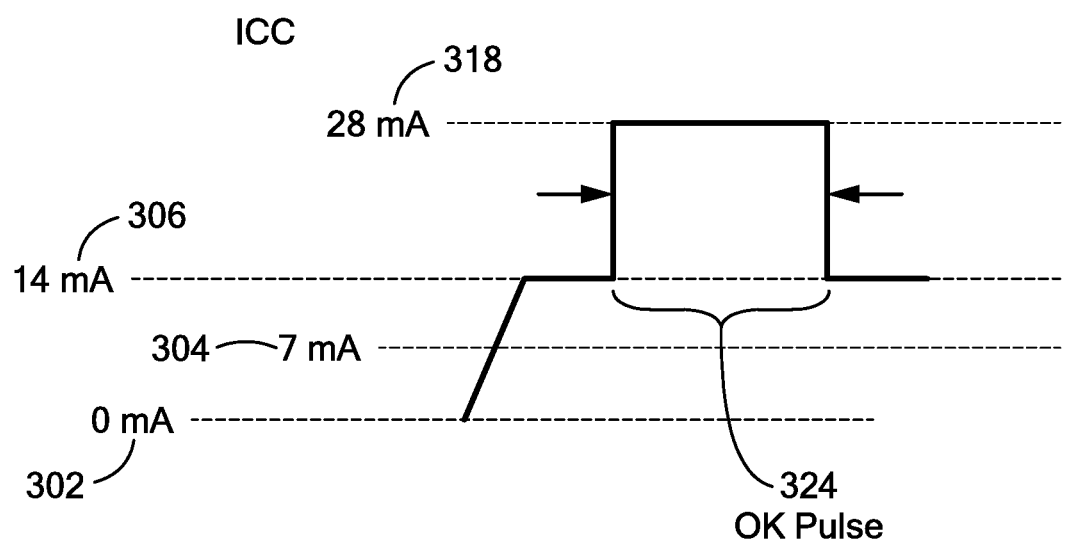

Referring also to FIGS. 4C and 4D, in which the horizontal axis represents arbitrary units of time and the vertical axis represents sensor output signal level in amperes, another signal format is illustrated to communicate test circuit operational status for use with a different two-wire output sensor having three possible signal levels. In this example, during normal sensor operation (following the power on diagnostics), the output signal can have a first, lowest level 304 (e.g., 7 mA), a second, intermediate signal level 306 (e.g., 14 mA), or a third, highest level 318 (e.g., 28 mA). In this type of a sensor output, the third level 318 can be used to communicate a particular sensed parameter such as target rotation direction for example and the frequency of transitions between signals level 304, 306 can be used to communicate target rotational speed for example.

In the example signals of FIGS. 4C and 4D, test circuit operational status is communicated by pulse width. For example, a first pulse 322 having a first pulse width can indicate that the tested test circuit(s) are functioning properly (and can thus correspond to an "OK pulse") and a second pulse 324 having a second pulse width different than the first pulse width can indicate that one or more tested test circuits are faulty (and can thus correspond to a "NOT OK pulse"). While the first pulse width of pulse 322 is shown to be smaller than the second pulse width of pulse 324, it will be appreciated that the relationship between the pulse widths can be reversed. It will also be appreciated that the polarity of the signal and thus of the pulses 322, 324 can be inverted. Here again with pulses 322, 324 being provided during power on diagnostic operation, it is not required that their pulse widths be different than pulse widths used during normal operation to communicate other information (e.g., target rotational direction).

Referring to FIGS. 5A, 5B, 5C, and 5D, in which the horizontal axis represents arbitrary units of time and the vertical axis represents sensor output signal level in volts, a signal format to communicate test circuit operational status during power on diagnostic operation for use with a sensor output having four possible levels (i.e., having two possible sets of signal levels) during normal operation is shown. An example of such a sensor output is described in U.S. Pat. No. 10,216,559 entitled "Diagnostic Fault Communication", which patent is assigned to the Assignee of the subject application and incorporated herein by reference in its entirety, and shown in FIGS. 5A and 5B. In this type of sensor, the output signal can have a first set of signal levels (levels 404, 406) when a fault signal is not generated by a test circuit (as illustrated by pulse 410 in FIG. 5A) and can have a second, different set of signal levels (levels 402, 408) when a fault signal indicates a fault (as illustrated by ASIL safe state pulse 412 in FIG. 5B).

Figure 5A:
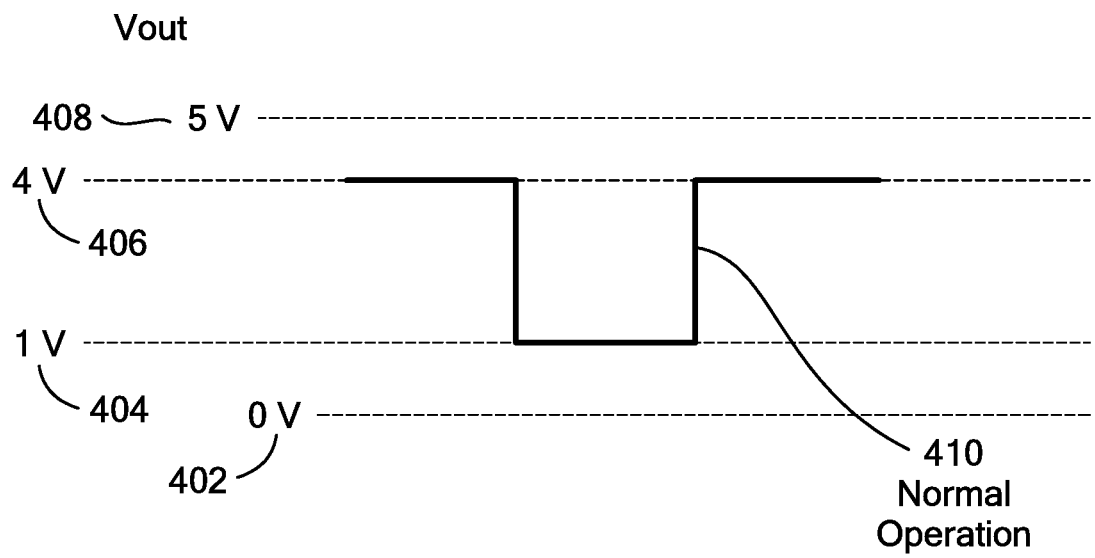
FIGS. 5A and 5B show example sensor output signals for encoding fault signals by voltage amplitude.
Figure 5B:
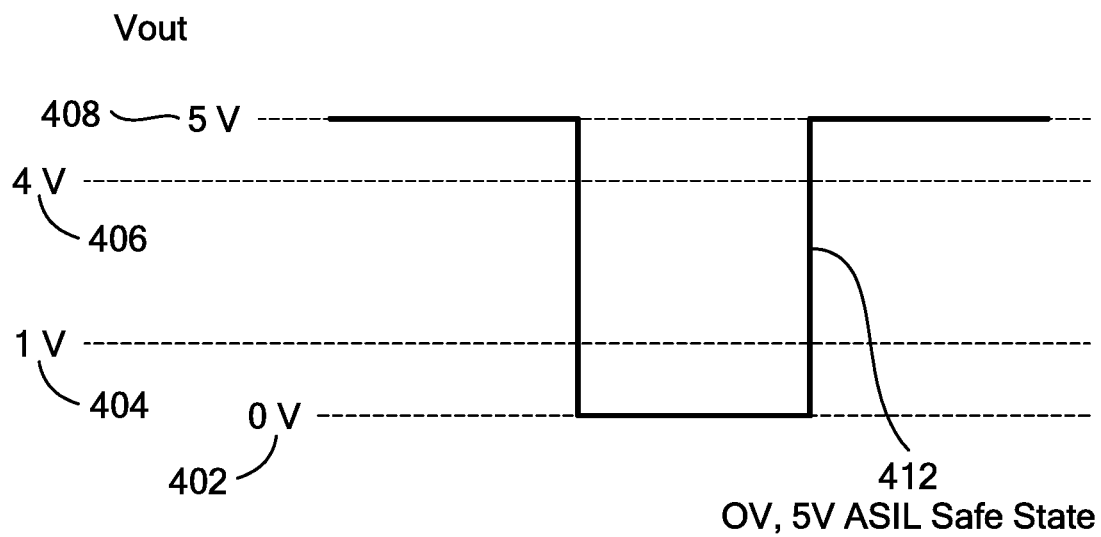
Figure 5C:
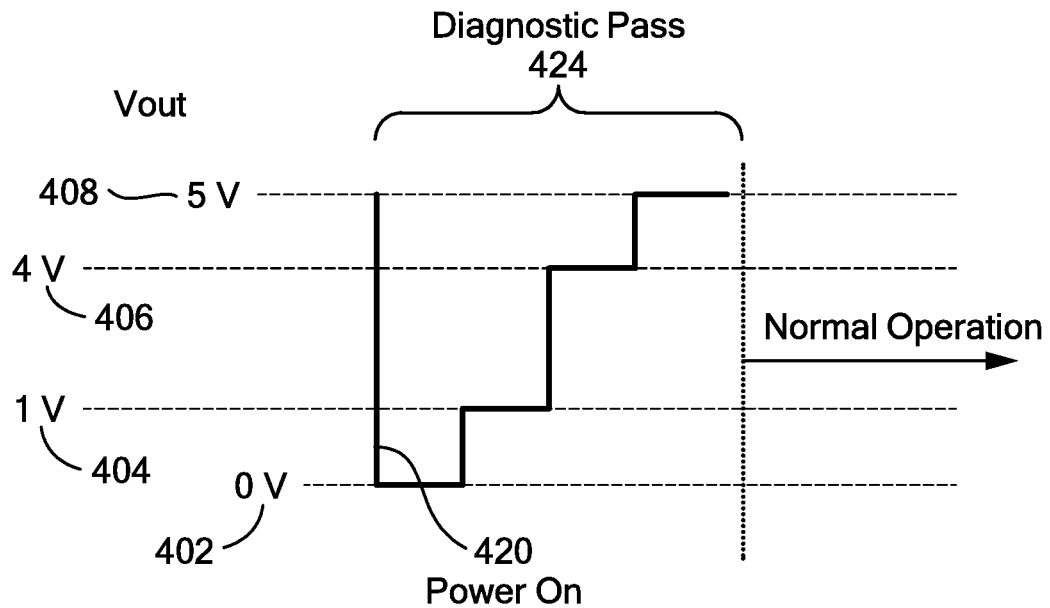
FIGS. 5C and 5D show example sensor output signals for encoding test circuit diagnostic information by an increasing and decreasing amplitude respectfully.
Figure 5D:
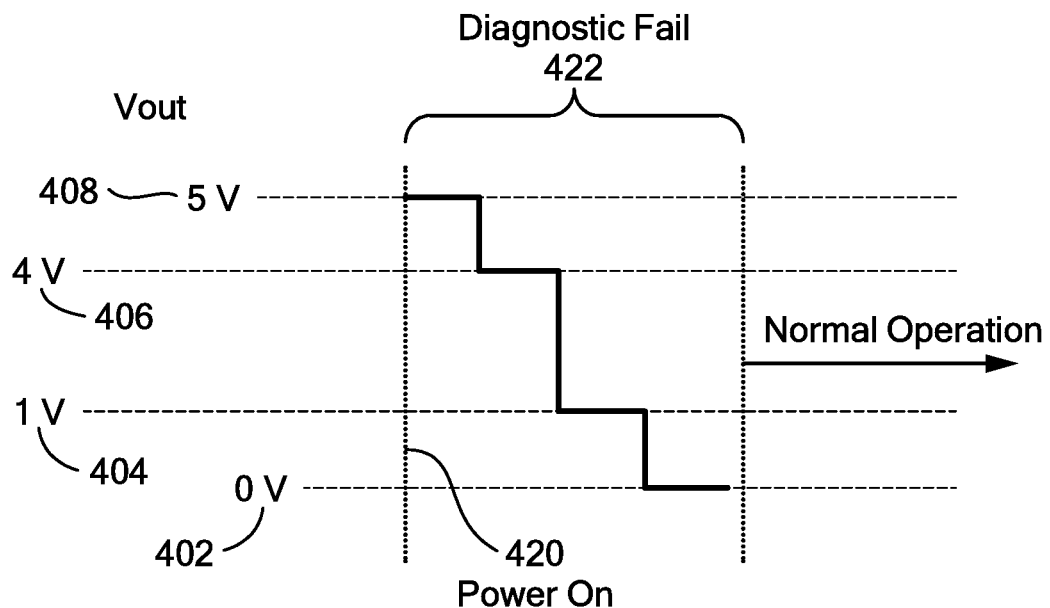

In the example signals of FIGS. 5C and 5D, test circuit operational status is communicated by signal direction and/or shape. In particular, FIG. 5C illustrates an increasing signal level (i.e., a "rising staircase") format 424 following the power on time 420 being used to communicate that one or more test circuits are functioning properly and FIG. 5D illustrates a decreasing signal level (i.e., a "falling staircase") format 422 following the power on time 420 being used to communicate that one or more test circuits is faulty. It will be appreciated that the size of the steps in the formats 422, 424 can be varied and need not all be the same. Also, it will be appreciated that while the increasing format 424 is shown to be monotonically increasing and the decreasing format 422 is shown to be monotonically decreasing, it is not required that the formats be monotonic. As one non-limiting example, the falling staircase signal format 422 can include one or more rising steps amongst the falling steps.

Referring also to FIGS. 6A, 6B, 6C, 6D and 7 various output signal formats to communicate test circuit operational status during normal operation (i.e., referred to alternatively as continuous checking) are shown. Because these signal formats occur during normal sensor operation, they must be distinguishable from formats used to communicate other information intended to be detected by the sensor, such as target speed and direction for example. In these examples, test circuit diagnostics can be performed periodically, such as once every 0.5 msec and the diagnostic results can be encoded on the next output pulse or other output event (e.g., standstill pulse). Alternatively, the test circuit diagnostics can be performed based on, or triggered by some event, for example, each time the sensor output switches (see, e.g., FIGS. 6A, 6B) or each time a so-called standstill pulse occurs (see, e.g., FIGS. 6C, 6D). A standstill pulse can refer to a pulse generated when the target 15 is not moving (i.e., zero speed) but sensor 20 still operational. For example, a standstill pulse can be output by the sensor every 800 msec when the target is not moving.

Figure 6A:
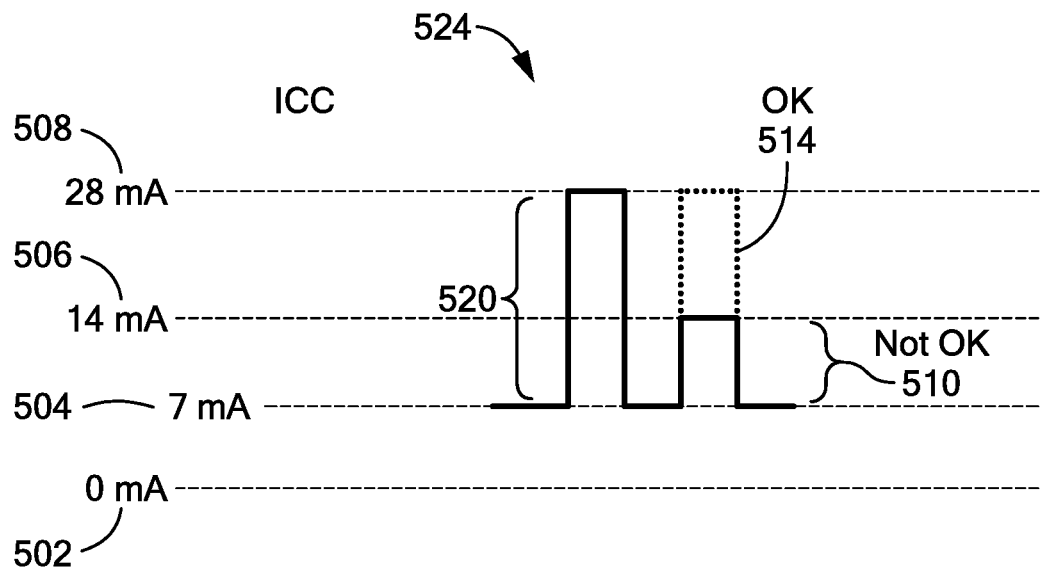
FIGS. 6A and 6B show example sensor output signals for encoding test circuit diagnostic information by a voltage amplitude of a second pulse following a detector output transition.
Figure 6B:
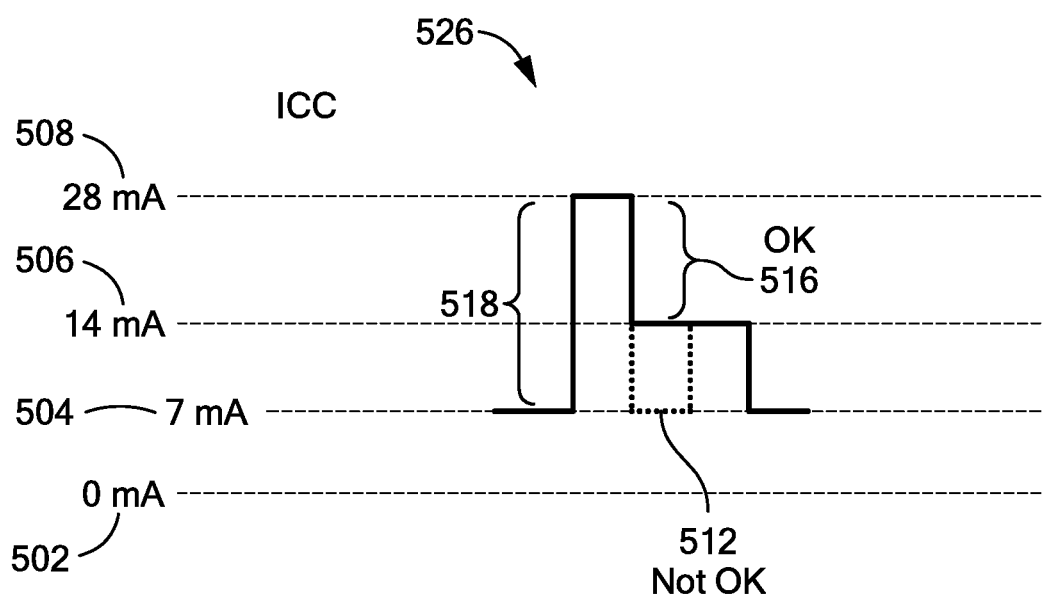

Referring to FIGS. 6A and 6B, in which the horizontal axis represents arbitrary units of time and the vertical axis represents sensor output signal level in amperes, a signal format to communicate test circuit operational status for use with a two-wire output sensor having three possible signal levels is shown. In this example, during normal sensor operation (following the power on diagnostics), the output signal can have a first, lowest level 504 (e.g., 7 mA), a second, intermediate signal level 506 (e.g., 14 mA), or a third, highest level 508 (e.g., 28 mA).

In FIGS. 6A and 6B, the test circuit operational status can be communicated following a transition of the sensor output signal (i.e., can be triggered based on a transition of the sensor output signal) by appending a second pulse (i.e., an operational status pulse) to the first pulse (e.g., a speed pulse). In particular, in FIG. 6A, the operational status pulse 514 can have a first amplitude 508 if the test circuit operational status is acceptable and the operational status pulse 510 can have second amplitude 506 different than the first amplitude if the test circuit operational status is faulty. This arrangement of communicating the test circuit operational status as a second pulse appended to a normal operation pulse 520 can be advantageous in order to eliminate or at least reduce the possibility of a pulse collision.

In FIG. 6B, the test circuit operational status is again communicated following a transition of the sensor output signal (i.e., can be triggered based on a transition of the sensor output signal) by appending a second pulse (i.e., an operational status pulse) to the first pulse 518 (e.g., a speed pulse). Here, the operational status pulse 516 can have a first amplitude 506 if the test circuit operational status is acceptable and the operational status pulse 512 can have second amplitude 504 different than the first amplitude if the test circuit operational status is faulty. The example of FIG. 6B differs from FIG. 6A in the levels of the operational status pulses and how the operational status pulse is appended to the output signal transition, as shown.

Figure 6C:
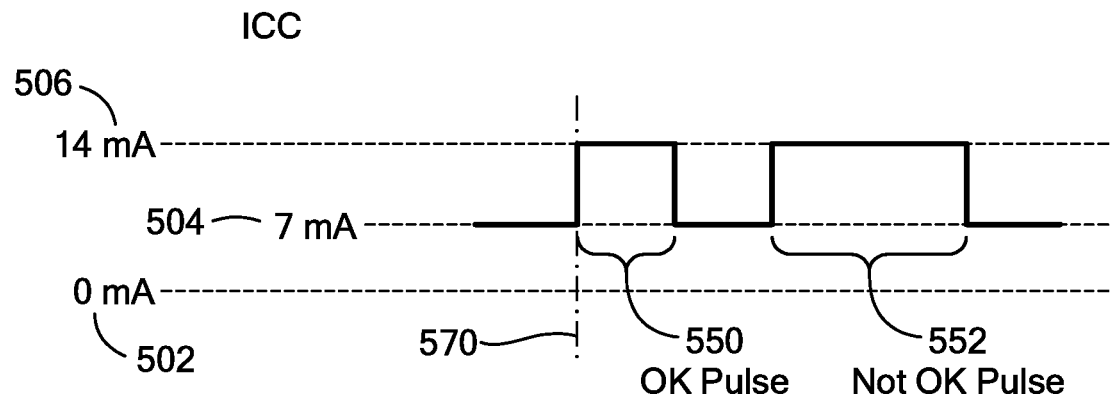
FIGS. 6C and 6D show example sensor output signals for encoding test circuit diagnostic information by pulse width of a second pulse following a standstill pulse.
Figure 6D:
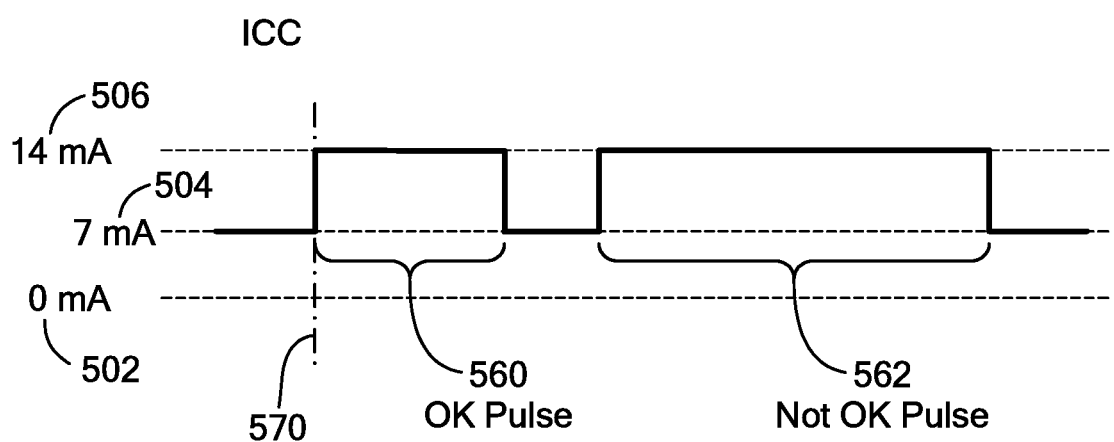

Referring to FIGS. 6C and 6D, in which the horizontal axis represents arbitrary units of time and the vertical axis represents sensor output signal level in amperes, a signal format to communicate test circuit operational status for use with a two-wire output sensor with two possible signal levels is shown. In FIGS. 6C and 6D, the test circuit operational status can be communicated following a standstill pulse 570. Here, the test circuit operational status is encoded by pulse width during normal operation even though sensed parameter information such as target rotation direction is encoded by pulse width. For example, a pulse 550 with a first pulse width (e.g., 45 μsec) can be used to communicate forward rotation with a passing test circuit status, a pulse 552 with a second pulse width (e.g., 90 μsec) can be used to communicate forward rotation with a faulty test circuit status, a pulse 560 having a third pulse width (e.g., 180 μsec) can be used to communicate reverse rotation with a passing test circuit status, and a pulse 562 with a fourth pulse width (e.g., 360 μsec) can be used to communicate reverse rotation with a faulty test circuit status. In this way, by defining four unique pulse widths, both target rotational direction and test circuit operational status can be communicated. It will be appreciated that the pulses 550, 552, 560, 562 can be generated at various periodic time intervals and/or triggered by various events (such as the illustrated standstill pulse 570).

Figure 7:
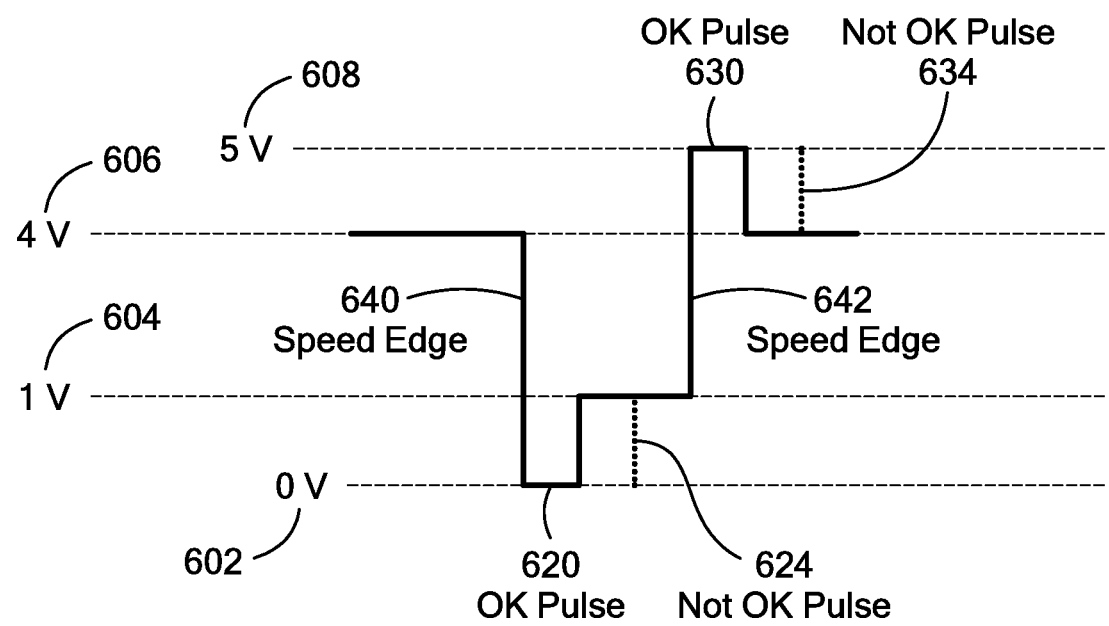
FIG. 7 shows an example sensor output signal for encoding test circuit diagnostic information by pulse width following a detector output transition.

Referring also to FIG. 7, in which the horizontal axis represents arbitrary units of time and the vertical axis represents sensor output signal level in volts, a signal format is illustrated to communicate during a power on sequence test circuit operational status for use with a sensor output having four possible levels (i.e., having two possible sets of signal levels) during normal operation. In this example, during normal sensor operation, the output signal can be between signal levels 604, 606 to communicate sensed parameter information such as target rotational speed. The signal levels 602, 608 can be used to communicate test circuit operational status following a transition of the senor output signal (i.e., following a speed edge 640, 642). For example, if the test circuit operational status is acceptable, then a pulse 620, 630 having a first pulse width at one of signal levels 602, 608 can be provided; whereas, if the test circuit operational status is determined to be faulty, then a pulse 624, 634 having a second pulse width different than the first pulse width (and here larger than the first pulse width) at one of signal levels 602, 608 can be provided as shown. This arrangement permits the signals levels 602, 608 to still be used to communicate a safe state based on a fault output signal from one or more of the test circuits.

It will be appreciated that the various encoding schemes described herein can be expanded in order to not only communicate whether one or more test circuits 40, 45, 55, 56 under test are operating properly or are faulty, but additionally to communicate which one or ones of a plurality of test circuits are faulty.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A sensor comprising:
   a detector configured to sense a parameter;
   at least one test circuit configured to detect a respective fault condition of the sensor and generate a fault signal in response to detecting the fault condition;
   a checker configured to test the at least one test circuit to determine the operational status of the at least one test circuit; and
   an output signal generator, coupled to receive the sensed parameter, the fault signal, and the operational status of the at least one test circuit, and configured to generate an output signal of the sensor to communicate the sensed parameter and the operational status of the at least one test circuit.

2. The sensor of claim 1, wherein the at least one test circuit comprises a threshold and wherein the checker is configured to test the at least one test circuit by inputting a value to the at least one test circuit that is greater than or less than the threshold.

3. The sensor of claim 1, wherein the checker is configured to mask the fault signal generated by the at least one test circuit prior to testing the at least one test circuit.

4. The sensor of claim 3, wherein the checker is configured to mask the fault signal generated by the at least one test circuit for a predetermined duration after sensor start up.

5. The sensor of claim 3, wherein the checker is configured to un-mask the fault signal of the at least one test circuit after testing the at least one test circuit.

6. The sensor of claim 1, wherein the checker is configured to store the operational status of the at least one test circuit in a memory.

7. The sensor of claim 1, wherein the sensor transitions to a safe mode of operation in response to the fault signal detecting the fault condition.

8. The sensor of claim 7, wherein the safe mode comprises reducing an amount of current consumed by the sensor below a predetermined value.

9. The sensor of claim 1, wherein the sensor transitions to a safe mode of operation when the operational status of the at least one test circuit is faulty.

10. The sensor of claim 9, wherein the safe mode comprises reducing an amount of current consumed by the sensor below a predetermined value.

11. The sensor of claim 1, wherein the output signal generator is configured to generate the sensor output signal comprising a pulse having a first width when the operational status of the at least one test circuit is not faulty and a second width when the operational status of the at least one test circuit is faulty, wherein the second width is different than the first width.

12. The sensor of claim 1, wherein the output signal generator is configured to generate the sensor output signal comprising a pulse having a first amplitude when the operational status of the at least one test circuit is not faulty and a second amplitude when the operational status of the at least one test circuit is faulty, wherein the second amplitude is different than the first amplitude.

13. The sensor of claim 1, wherein the output signal generator is configured to generate the sensor output signal comprising one of an increasing amplitude or a decreasing amplitude when the operational status of the at least one test circuit is not faulty and comprising the other one of the increasing amplitude or the decreasing amplitude when the operational status of the at least one test circuit is faulty.

14. The sensor of claim 13, wherein the increasing amplitude comprises a monotonically increasing amplitude and wherein the decreasing amplitude are monotonically decreasing amplitude.

15. The sensor of claim 13, wherein the increasing amplitude comprises a non-monotonically increasing amplitude and wherein the decreasing amplitude are non-monotonically decreasing amplitude.

16. The sensor of claim 1, wherein the checker is configured to test the at least one test circuit to determine the operational status of the at least one test circuit during a start up mode of operation.

17. The sensor of claim 1, wherein the checker is configured to test the at least one test circuit to determine the operational status of the at least one test circuit periodically during a normal mode of operation.

18. The sensor of claim 1, wherein the detector is configured to generate a detector output signal comprising a speed pulse and wherein the output signal of the sensor comprises the speed pulse and an operational status pulse following the speed pulse, wherein the operational status pulse is indicative of the operational status of the at least one test circuit.

19. The sensor of claim 18, wherein the operational status pulse has a first amplitude when the operational status of the at least one test circuit is not faulty and a second amplitude when the operational status of the at least one test circuit is faulty, wherein the first amplitude is different than the second amplitude.

20. The sensor of claim 1, wherein the detector is configured to generate a detector output signal comprising a standstill pulse and wherein the output signal of the sensor comprises the standstill pulse and an operational status pulse following the standstill pulse, wherein the operational status pulse is indicative of the operational status of the at least one test circuit.

21. The sensor of claim 20, wherein the operational status pulse has a first width when the operational status of the at least one test circuit is not faulty and a second width when the operational status of the at least one test circuit is faulty, wherein the first width is different than the second width.

22. The sensor of claim 1, wherein the sensor comprises one or more magnetic field sensing elements and wherein the sensed parameter comprises one or both of a speed of motion of a target or a direction of motion of the target.

23. The sensor of claim 22, wherein the sensor further comprises an oscillator having an operating frequency, a voltage regulator configured to generate a regulated voltage, an analog signal path to process an analog signal generated by the one or more magnetic field sensing elements, an analog-to-digital converter configured to convert the analog signal into a digital signal, and a digital processor configured to process the digital signal, and a memory, and wherein the at least one test circuit is configured to detect one or more of a fault condition of the operating frequency of the oscillator, the regulated voltage, a voltage range of the analog signal, an input range of an analog-to-digital converter, the digital processor, and a parity of the memory.

24. A method comprising:
sensing a parameter with a detector;
detecting a fault condition of the detector with at least one test circuit;
testing the at least one test circuit to determine an operational status of the at least one test circuit; and
generating an output signal comprising the parameter and the operational status of the at least one test circuit.

25. The method of claim 24 wherein sensing the parameter comprises one or both of sensing a speed of motion of a target or sensing a direction of motion of the target with one or more magnetic field sensing elements.

26. The method of claim 24 wherein generating the output signal comprises encoding the operational status of the at least one test circuit with one or more of a signal pulse width or amplitude.

27. The method of claim 24 further comprising ignoring a result of detecting the fault condition prior to testing the at least one test circuit.

28. A sensor comprising:
a detector configured to sense a parameter;
at least one test circuit configured to detect a respective fault condition of the sensor and generate a fault signal in response to detecting the fault condition;
a checker configured to test the at least one test circuit to determine the operational status of the at least one test circuit; and
means, coupled to receive the sensed parameter, the fault signal, and the operational status of the at least one test circuit, for generating an output signal of the sensor to communicate the sensed parameter and the operational status of the at least one test circuit.

* * * * *

UNITED STATES PATENT AND TRADEMARK OFFICE
CERTIFICATE OF CORRECTION

PATENT NO. : 11,194,004 B2
APPLICATION NO. : 16/788505
DATED : December 7, 2021
INVENTOR(S) : P. Karl Scheller et al.

It is certified that error appears in the above-identified patent and that said Letters Patent is hereby corrected as shown below:

In the Specification

Column 1, Line 59 delete "aspect" and replace with --aspects--.

Column 6, Line 51 delete "embedment" and replace with --embodiment--.

Column 8, Line 18 delete "be non-crystal" and replace with --be a non-crystal--.

Column 8, Line 26 delete "by signals" and replace with --by signal--.

Column 10, Line 65 delete "knows" and replace with --known--.

Column 11, Line 28 delete "diagnostic flagged" and replace with --diagnostic is flagged--.

Column 11, Line 64 delete "circuits" and replace with --circuit--.

Column 13, Line 42 delete "signals level" and replace with --signal levels--.

Column 14, Line 47 delete "20 still" and replace with --20 is still--.

Column 15, Line 1 delete "have second" and replace with --have a second--.

Column 15, Line 58 delete "senor" and replace with --sensor--.

Signed and Sealed this
Thirteenth Day of December, 2022

Katherine Kelly Vidal
*Director of the United States Patent and Trademark Office*